United States Patent
Ogawa et al.

(10) Patent No.: US 7,740,936 B2
(45) Date of Patent: *Jun. 22, 2010

(54) ADHESION ASSISTING AGENT FITTED METAL FOIL, AND PRINTED WIRING BOARD USING THEREOF

(75) Inventors: Nobuyuki Ogawa, Tsukuba (JP); Hitoshi Onozeki, Chikusei (JP); Takahiro Tanabe, Oyama (JP); Kenji Takai, Saitama (JP); Norio Moriike, Chikusei (JP); Shin Takanezawa, Chikusei (JP); Takako Ejiri, Chikusei (JP); Toshihisa Kumakura, Chikusei (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 439 days.

This patent is subject to a terminal disclaimer.

(21) Appl. No.: 11/718,986

(22) PCT Filed: Nov. 10, 2005

(86) PCT No.: PCT/JP2005/020621
§ 371 (c)(1),
(2), (4) Date: May 10, 2007

(87) PCT Pub. No.: WO2006/051864
PCT Pub. Date: May 18, 2006

(65) Prior Publication Data
US 2008/0145689 A1 Jun. 19, 2008

(30) Foreign Application Priority Data
Nov. 10, 2004 (JP) ............................. 2004-326649
Jan. 12, 2005 (JP) ............................. 2005-005130
May 27, 2005 (JP) ............................. 2005-155331

(51) Int. Cl.
*B32B 15/00* (2006.01)

(52) U.S. Cl. ........... 428/344; 428/355 EP; 428/355 BL; 428/355 CN; 428/612; 428/621; 428/640; 428/644; 428/666; 428/667; 428/678; 174/259

(58) Field of Classification Search ................. 428/209, 428/901, 355 EP, 355 BL, 344, 355 CN, 428/612, 621, 640, 644, 666, 667, 678; 174/250–258, 174/259
See application file for complete search history.

(56) References Cited

U.S. PATENT DOCUMENTS 4,451,317 A 5/1984 Oizumi et al.

(Continued)

FOREIGN PATENT DOCUMENTS

CN 1523058 8/2004

(Continued)

OTHER PUBLICATIONS

Korean Official Action mailed Nov. 20, 2008, for Application No. 10-2007-7012686.
Chinese Official Action issued May 22, 2009, for Application No. 200580025949.6.
Written Opinion and Search Report for Singapore Application No. 200703220-4, dated Jan. 14, 2008.

*Primary Examiner*—Cathy Lam
(74) *Attorney, Agent, or Firm*—Antonelli, Terry, Stout & Kraus, LLP.

(57) ABSTRACT

Provided is an adhesion assisting agent fitted metal foil, comprising an adhesion assisting agent layer having a thickness of 0.1 to 10 μm on a metal whose surface has a ten-point average roughness Rz of 2.0 μm or less, wherein the adhesion assisting agent layer is formed from an adhesion assisting agent composition comprising: (A) an epoxy resin selected from the group consisting of a novolak epoxy resin and an aralkyl epoxy resin; and (C) an epoxy resin curing agent.

24 Claims, 2 Drawing Sheets

U.S. PATENT DOCUMENTS

| | | | |
|---|---|---|---|
| 5,053,280 A * | 10/1991 | Takanezawa et al. | 428/413 |
| 5,366,814 A * | 11/1994 | Yamanishi et al. | 428/607 |
| 5,622,782 A * | 4/1997 | Poutasse et al. | 428/344 |
| 6,113,730 A | 9/2000 | Ohya et al. | |
| 6,748,652 B2 * | 6/2004 | Andou et al. | 29/852 |
| 6,979,712 B2 * | 12/2005 | Takanezawa et al. | 525/109 |
| 7,473,458 B2 * | 1/2009 | Takai et al. | 428/209 |
| 7,572,503 B2 * | 8/2009 | Takanezawa et al. | 428/355 EP |
| 2002/0162687 A1 | 11/2002 | Akihiko | |
| 2004/0161612 A1 | 8/2004 | Takanezawa et al. | |
| 2004/0176526 A1 | 9/2004 | Shimo-Ohsako et al. | |

FOREIGN PATENT DOCUMENTS

| | | |
|---|---|---|
| EP | 1170 983 | 1/2002 |
| JP | 05-029761 | 2/1993 |
| JP | 07-221444 | 8/1995 |
| JP | 09-246730 | 9/1997 |
| JP | 10-004254 | 1/1998 |
| JP | 2003-158364 | 5/2003 |
| JP | 2003-229648 | 8/2003 |
| JP | 2003-277579 | 10/2003 |
| JP | 2004-022917 | 1/2004 |
| JP | 2004-075748 | 3/2004 |
| JP | 2004-250470 | 9/2004 |
| WO | WO 01/19607 | 3/2001 |

* cited by examiner

ADHESION ASSISTING AGENT FITTED METAL FOIL, AND PRINTED WIRING BOARD USING THEREOF

TECHNICAL FIELD

The present invention relates to an adhesion assisting agent fitted metal foil, and a printed-wiring board using the same. The invention also relates to a process for producing a printed-wiring board using the adhesion assisting agent fitted metal foil. Furthermore, the invention relates to a multi-layered wiring board, a semiconductor chip mounted board and a semiconductor packaged board, using the adhesion assisting agent fitted metal foil.

BACKGROUND ART

In recent years, electronic appliances have been required to be compact, lightweight and high speed, and high densification of printed wiring boards has advanced. Production of a printed wiring board by a semi-additive method using electroplating has been drawing attention. Japanese Patent Application Laid-Open (JP-A) No. 10-4254 discloses a semi-additive method of making interstitial via holes (hereinafter referred to as IVHs) in a resin on which a circuit is to be formed, roughening the surface of the resin by chemical, giving a Pd catalyst thereto, conducting electroless plating to form a patterned, electroplating resist, and then forming the circuit by pattern-electroplating. This method makes it possible to form finer wiring as compared with the subtractive method that an amount of side-etching is large. Furthermore, there is a method of forming a circuit onto a resin-fitted metal foil by a semi-additive method. In order to make the thickness of a metal foil thinner, JP-A No. 2003-158364 discloses a substrate material wherein copper foils of 5 μm thickness or less are put to both faces of an insulating resin. According to this manner, failures based on short circuits in a conductor circuit are less, so that printed-wiring boards having good circuit-formability can be produced. JP-A No. 7-221444 discloses a method of forming a copper layer of about 1 μm thickness on a single face of a polyimide film by using an electron beam vapor-deposition device, and laminating the resultant onto an inner layer circuit through an adhesive or prepreg, so as to be rendered a power supply layer.

In the methods of JP-A Nos. 10-4254 and 2003-158364 out of the above-mentioned methods, the shape of the roughened surface disturbs the formation of fine wiring. Additionally, according to these methods, there is generated an inconvenience that electric properties of the resultant are lowered by the shape of the roughened surface. Since no roughened surface shape is formed in the method of JP-A No. 7-221444, the method is advantageous for forming fine wiring or the electric properties. However, the substrate itself becomes expensive. Thus, the method lacks versatility.

JP-A No. 2004-025835 discloses a method of conducting circuit-formation by using a smooth very thin copper foil as a power supply layer to form fine wiring inexpensively. In this method, IVHs are made from the upper face of the smooth very thin copper foil, which is present on an insulating layer, for interlaminar connection. Electroless copper plating is then performed, and an image of a resist is formed. Thereafter, a circuit is formed. The method for making IVHs is classified into three kinds of methods: the direct laser perforating method, the conformal perforating method, and the large window method. In the direct perforating method, a laser ray is directly irradiated onto a copper foil so as to form IVHs. In the conformal perforating method, windows having a diameter equal to that of IVHs are made by photolithography, and then a laser ray larger than each of the windows is irradiated to make the IVHs. In the large window method, windows larger than the diameter of IVHs are made in a copper foil, and then a laser ray as large as the IVH diameter is irradiated to make the IVHs. In the method described in JP-A No. 2004-025835, it is difficult to use any method other than the direct laser perforating method. This is based on the following reason: when windows are formed by photolithography, it is difficult to form a resist at the end of a substrate; therefore, the resin at the substrate end is naked. On the resin, which is smooth, electroless copper plating peel is not obtained; therefore, there are generated inconveniences such that electroless copper is peeled in the process for mass production. Alternatively, when windows larger than the diameter of IVHs are made in a copper foil by the large window method, the resin outside the IVHs is naked. In this case also, there is caused a problem that plating around the IVHs is peeled.

It has been desired to provide wiring boards which overcome the above-mentioned problems and are advantageous in the formation of fine wiring, electric properties and production costs. Additionally, it has been desired to provide wiring boards which are high in reliability and good in high frequency properties.

DISCLOSURE OF THE INVENTION

An embodiment of the present invention relates to an adhesion assisting agent fitted metal foil, comprising an adhesion assisting agent layer having a thickness of 0.1 to 10 μm on a metal whose surface has a ten-point average roughness Rz of 2.0 μm or less, wherein the adhesion assisting agent layer is formed from an adhesion assisting agent composition comprising: (A) an epoxy resin selected from the group consisting of a novolak epoxy resin and an aralkyl epoxy resin; and (C) an epoxy resin curing agent.

More specifically, the present invention relates to embodiments described in the following items (I) to (III):

(I) An embodiment of the present invention relates to an adhesion assisting agent fitted metal foil comprising an adhesion assisting agent layer having a thickness of 0.1 to 10 μm on a metal whose surface has a ten-point average roughness Rz of 2.0 μm or less, wherein the adhesion assisting agent layer is formed from an adhesion assisting agent composition comprising: (A) a novolak epoxy resin, (B) a polymer component which is able to be chemically roughed, (C) an epoxy resin curing agent, and (D) a curing accelerator. The component (A) preferably has a biphenyl structure. The component (B) may comprise cross-linked rubber particles. The cross-linked rubber particles may be selected from acrylonitrile butadiene rubber, carboxylic acid modified acrylonitrile butadiene rubber, carboxylic acid modified acrylonitrile butadiene rubber particles, and particles having a butadiene rubber core and an acrylic acid shell. The component (B) may comprise a polyvinyl acetal resin. The polyvinyl acetal resin may be selected from a polyvinyl acetal resin and a carboxylic acid modified polyvinyl acetal resin. In the adhesion assisting agent composition, the amount of the component (B) is from 0.5 to 25 parts by weight for 100 parts by weight of the component (A). The component (C) may comprise a phenol novolak resin. The phenol novolak resin may be a triazine-ring-containing phenol novolak resin. Preferably, the surface of the metal is not subjected to any roughening treatment for promoting adhesive force. The metal is preferably copper foil subjected to rust preventing treatment with at least one selected from zinc, chromium, nickel and oxide thereof. The surface of the metal is preferably subjected to silane coupling treatment. An embodiment of the present invention is a printed-wiring board produced by use of the adhesion assisting agent fitted metal foil, wherein the peeling strength between the adhesion assisting agent layer of the adhesion assisting agent fitted insulating layer and an electroconductive circuit is 0.6 kN/m or more at 20° C. Furthermore, an embodiment of the present invention is a printed-wiring board which is produced by use of the adhesion assisting agent fitted metal foil and has any one of a through hole structure and an interstitial via hole structure, a first plating being formed by electroless copper plating after chemical roughening in the case that the through hole structure or the interstitial via hole structure is formed. According to the present invention, plating peeling can be prevented during the process.

(II) An embodiment of the present invention relates to an adhesion assisting agent fitted metal foil comprising, on a metal foil whose surface has a ten-point average roughness Rz of 2.0 μm or less, an adhesion assisting agent layer of 0.1 to 10 μm in thickness which comprises an adhesion assisting agent composition comprising (A) an aralkyl epoxy resin and (C) an epoxy resin curing agent wherein the component (C) comprises an aralkyl resin having a phenolic hydroxyl group. The adhesion assisting agent composition may further comprise, as the component (C), 3 to 50% by equivalent of a triazine-ring-containing novolak resin having a phenolic hydroxyl group. The adhesion assisting agent composition may further comprise (B) a polymer component which is able to be chemically roughened, and the amount of the component (B) may be from 0.5 to 25 parts by weight for 100 parts by weight of the component (A). The component (B) may be selected from acrylonitrile butadiene rubber, carboxylic acid modified acrylonitrile butadiene rubber, carboxylic acid modified acrylonitrile butadiene rubber particles, particles having a butadiene rubber core and an acrylic resin shell, a polyvinyl acetal resin, and a carboxylic acid modified polyvinyl acetal resin. Preferably, the surface of the metal foil is not subjected to any roughening treatment. The metal foil is preferably copper foil subjected to rust preventing treatment with at least one selected from nickel, tin, zinc, chromium, molybdenum, cobalt and oxide thereof. A printed-wiring board may be produced by use of the adhesion assisting agent fitted metal foil.

(III) An embodiment of the present invention relates to an adhesion assisting agent fitted metal foil which comprises an adhesion assisting agent layer having a thickness of 0.1 to 10 μm on a metal whose surface has a ten-point average roughness Rz of 2.0 μm or less, the surface of the adhesion assisting agent layer being able to undergo electroless plating by roughening the surface of the adhesion assisting agent layer chemically after any metal is chemically removed, wherein the adhesion assisting agent layer is formed from an adhesion assisting agent composition comprising (A) an epoxy resin, and the component (A) comprises a novolak epoxy resin. Preferably, the adhesion assisting agent composition comprises (A) an epoxy resin, (B) a polymer component which is able to be chemically roughened, (C) an epoxy resin curing agent, and (D) a curing accelerator, wherein the component (A) is preferably a novolak epoxy resin and a rubber modified epoxy resin. Furthermore, 10 to 80% by weight of the component (A) is preferably the rubber modified epoxy resin. The component (B) is selected from acrylonitrile butadiene rubber, carboxylic acid modified acrylonitrile butadiene rubber, carboxylic acid modified acrylonitrile butadiene rubber particles, particles having a butadiene rubber core and an acrylic acid shell, a polyvinyl acetal resin, and a carboxylic acid modified polyvinyl acetal resin. In the adhesion assisting agent composition, the amount of the component (B) may be from 0.5 to 25 parts by weight for 100 parts by weight of the component (A). The component (C) may comprise a phenol novolak resin and a triazine-ring-containing phenol novolak resin. Preferably, the surface of the metal foil is not subjected to any roughening treatment for promoting adhesive force. The metal is preferably copper foil subjected to rust preventing treatment with at least one selected from nickel, tin, zinc, chromium, molybdenum cobalt and oxide thereof. A printed-wiring board may be produced by an ordinary method using the adhesion assisting agent fitted metal foil.

According to the embodiments of the present invention, it is possible to produce a multi-layered wiring board which has a peeling strength equivalent to that obtained when a roughened copper foil is used while being capable of forming fine wiring, and which is excellent in moisture absorbing and heat resisting property.

According to the embodiments of the present invention, it is possible to provide a wiring board which is advantageous for the formation of fine wiring, electrical characteristics and production costs and has high reliability and good high-frequency property.

The present disclosure relates to subject matter contained in Japanese Patent Applications No. 2004-326649 filed on Nov. 10, 2004, No. 2005-005130 filed on Jan. 12, 2005 and No. 2005-155331 filed on May 27, 2005 the disclosure of which is expressly incorporated herein by reference in its entirety.

BEST MODES FOR CARRYING OUT THE INVENTION

Figure 1:
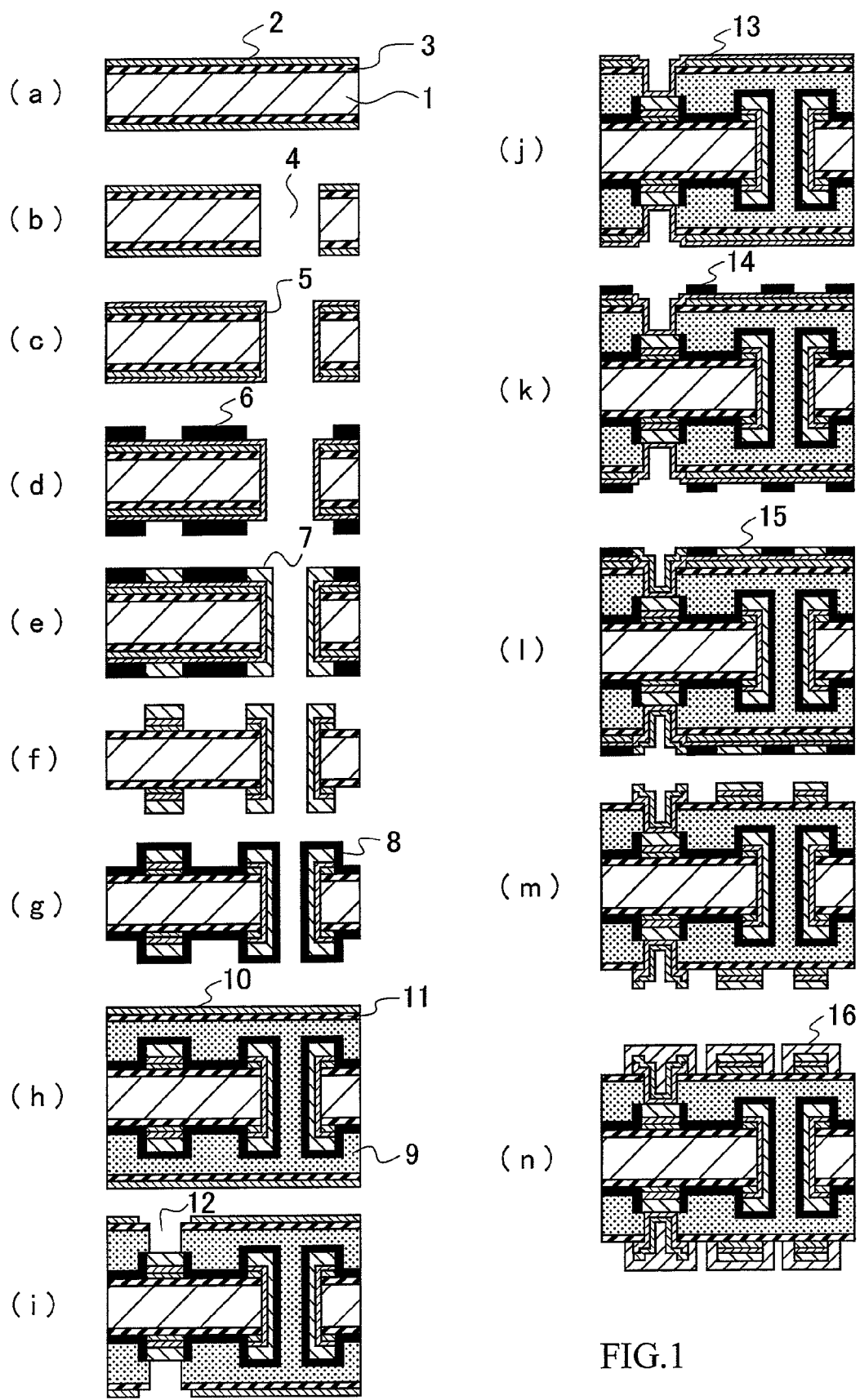
FIG. 1 is a sectional view illustrating an example of a process for producing a printed-wiring board according to the present invention.

One embodiment of the present invention relates to an adhesion assisting agent fitted metal foil, comprising an adhesion assisting agent layer having a thickness of 0.1 to 10 μm on a metal whose surface has a ten-point average roughness Rz of 2.0 μm or less, wherein the adhesion assisting agent layer is formed from an adhesion assisting agent composition comprising: (A) an epoxy resin selected from the group consisting of a novolak epoxy resin and an aralkyl epoxy resin; and (C) an epoxy resin curing agent.

As the surface roughness of the metal foil, a ten-point average roughness (Rz) according to JIS B 0601 of both surfaces is 2.0 μm or less from a viewpoint of electric characteristics. The examples of the metal foil include, but are not particularly limited to, copper, nickel, and aluminum foils. As the metal foil, commonly used copper foil can be used. When the metal foil is a copper foil, conditions for producing the copper foil in a copper sulfate bath are, for example, as follows: sulfuric acid: 50-100 g/L, copper: 30-100 g/L, liquid temperature: 20-80° C., and current density: 0.5-100 A/dm$^2$. In a copper pyrophosphate bath, the conditions are, for example, as follows: potassium pyrophosphate: 100-700 g/L, copper: 10-50 g/L, liquid temperature: 30-60° C., pH: 8-12, and current density: 1-10 A/dm$^2$. Various additives may be added thereto, considering physical properties and smoothness of the copper. The metal foil is commonly subjected to surface-roughening treatment called "roughening treatment". In the present invention, however, roughening treatment is not conducted so that the metal foil is characterized that the metal foil has no legs. The wording "the metal foil has no legs" means that the extent of unevenness on the metal foil is small.

When the extent of unevenness on the metal foil is small, copper foil does not remain on portions that no circuit is formed on the resin after etching.

Provided that surface roughness Rz of a metal foil is 2.0 μm or less, a glossy face of metal foil which is subjected to no roughening treatment can be used.

The thickness of the metal foil is not particularly limited. A metal foil having a thickness of 105 μm or less, which is generally used in a printed-wiring board, can be used. The surface roughness Rz of both faces thereof is preferably 2.0 μm or less.

In order to form fine wiring, the metal foil is a peelable type foil having a thickness of 5 μm or less preferably, more preferably 3.0 μm or less, and further the both surfaces having a roughness Rz of 2.0 μm or less is preferably. The peelable type metal foil has a carrier which can be peeled. For example, a very thin, peelable type copper foil is produced by forming a metal oxide or organic material layer, which becomes a peelable layer, on a carrier foil having a thickness of 10-50 μm and then forming a metal foil having a thickness of 0.3-5.0 μm thereon. In the case of a copper sulfate bath, the metal foil may be formed, for example, under the following conditions: sulfuric acid: 50-100 g/L, copper: 30-100 g/L, liquid temperature: 20-80° C., and current density: 0.5-100 A/dm$^2$. In the case of a copper pyrophosphate bath, the metal foil may be formed under the following conditions: potassium pyrophosphate: 100-700 g/L, copper: 10-50 g/L, liquid temperature: 30-60° C., pH: 8-12, and current density: 1-10 A/dm$^2$. In the case of using a foil such as a power supply layer, the wiring formability is good, which will be described later. Instead of the peelable type, there can be used an etchable type copper foil having an aluminum carrier or a nickel carrier.

The face of the metal foil onto which a resin is to be bonded is preferably subjected to rust preventing treatment. The rust preventing treatment can be conducted using any one of nickel, tin, zinc, chromium, molybdenum and cobalt, oxide thereof or an alloy thereof. It is preferred to conduct the rust preventing treatment with at least one selected from zinc and chromium. These can be formed into a thin film on the metal foil by sputtering, electroplating, or electroless plating. From the viewpoint of costs, electroplating is preferred. Specifically, the treatment is conducted by using a plating layer containing one or more of metal salts selected from nickel, tin, zinc, chromium, molybdenum and cobalt. From the viewpoint of later reliability and others, it is preferred to conduct plating which contains zinc. In order to make the precipitation of ions of the metal(s) easier, it is preferable to add a necessary amount of a complexation agent such as a citrate, a tartrate, or a sulfamine acid. The solution for the plating is usually used in an acidic range to conduct plating at a temperature from room temperature to 80° C. Usually, a current density of the plating is appropriately selected from the range of 0.1 to 10 A/dm$^2$, and a conducting time is appropriately selected from the range of 1 to 60 seconds, preferably 1 to 30 seconds. The amount of the rust preventing metal, though depends on the kind of the metal, and the total amount thereof is preferably from 10 to 2000 μg/dm$^2$. If the rust preventing treatment layer is too thick, etching hindrance and deterioration in the electric characteristics are caused. If it is too thin, a fall in the peeling strength to the resin may be caused.

Further, it is preferred to conduct a chromate treatment on the rust preventing treatment layer. When a chromate treatment layer is formed, a decrease in the peeling strength to the resin can be prevented. Thus, the treatment is useful. Specifically, the treatment is conducted by, using an aqueous solution containing hexavalent chromium ions. The chromate treatment can be conducted by mere immersion treatment. Preferably, the treatment is conducted by cathode treatment. The treatment is preferably conducted under the following conditions: sodium dichromate: 0.1-50 g/L. pH: 1-13, bath temperature: 0-60° C., current density: 0.1-5 A/dm$^2$, and electrolysis time: 0.1-100 seconds. Instead of sodium dichromate, potassium chromate or potassium dichromate may be used.

Furthermore, it is preferred that the outmost layer of the metal foil further adsorbs a silane coupling agent. Examples of the silane coupling agent include, but are not limited to, epoxy functional silanes such as 3-glycidoxypropyltrimethoxysilane and 2-(3,4-epoxycyclohexyl)ethyltrimethoxysilane; amino functional silanes such as 3-aminopropyltrimethoxysilane, N-2-(aminoethyl) 3-aminopropyltrimethoxysilane, and N-2-(aminoethyl) 3-aminopropylmethyldimethoxysilane; olefin functional silanes such as vinyltrimethoxysilane, vinylphenyltrimethoxysilane, and vinyltris(2-methoxyethoxy) silane; acrylic functional silanes such as 3-acryloxypropyltrimethoxysilane; methacrylic functional silanes such as 3-methacryloxypropyltrimethoxysilane; and mercapto functional silanes such as 3-mercaptopropyltrimethoxysilane. It is desired that the agent has an epoxy or amino group in the molecule, considering the compatibility thereof with the adhesion assisting agent which can be applied later.

These may be used alone or in the form of a mixture thereof. The coupling agent is adsorbed on the metal foil by dissolving the agent in a solvent such as water to give a concentration of 0.1 to 15 g/L and then applying or electrode positing the resultant onto the metal foil. The silane coupling agent(s) is/are condensed and bonded to hydroxy groups of the rust preventing metal on the surface of the metal foil, so as to be made into a coating film. Stable bonds are formed by heating, ultraviolet irradiation or the like after the silane coupling treatment. In the case of the heating, the foil treated with the silane coupling agent is dried at a temperature of 100 to 200° C. for 2 to 60 seconds. In the case of the ultraviolet irradiation, rays having wavelengths of 200 to 400 nm are irradiated at 200 to 2500 mJ/cm$^2$.

It is preferable that the copper foil treated with the silane coupling agent is coated with the adhesion assisting agent containing an epoxy resin as an essential component. The thickness of the adhesion assisting agent is desirably in the range of 0.1 to 10 μm. If the thickness is less than 0.1 μm, the adhesion assisting agent may not express its effect. If the thickness is more than 10 μm, the adhesion assisting agent has an advantage in adhesive force but the characteristics that an interlaminar insulating material has, such as heat resistance, dielectric property, connection reliability, and dimensional stability are deteriorated, which is not preferable. The interlaminar insulating layer used therein is a prepreg wherein a glass cloth substrate is impregnated with a high-Tg epoxy resin, a polyimide resin or a cyanate resin. This is because the adhesion assisting agent has a lower Tg, a large thermal expansion coefficient and a higher dielectric constant than the interlaminar insulating material. The thickness obtained by the applying is more preferably in the range of 0.1 to 5.0 μm. When the thickness ranges from 0.1 to 5.0 μm, the heat resistance, the dielectric property and other characteristics that the interlaminar insulating material has are hardly deteriorated.

The epoxy resin (A) contained in the adhesion assisting agent composition is selected from a novolak epoxy resin and an aralkyl epoxy resin.

The novolak epoxy resin is not particularly limited to, but is preferably a novolak epoxy resin having a biphenyl structure. The novolak epoxy resin having a biphenyl structure is a novolak epoxy resin containing an aromatic ring of a biphenyl derivative in the molecule. Examples thereof include epoxy resins represented by the following formula (1):

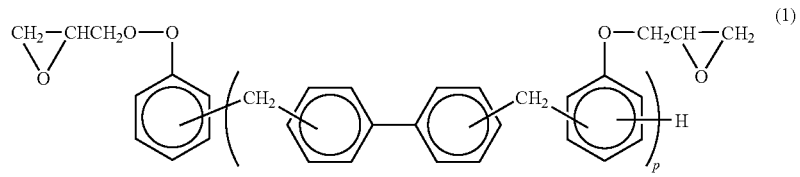

wherein p represents 1 to 5. These may be used alone or in combination of two or more thereof.

Examples of a commercially available product thereof include NC-3000S (an epoxy resin of the formula (1) wherein p is 1.7 on average) and NC-3000S-H (an epoxy resin of the formula (1) wherein p is 2.8 on average), manufactured by Nippon Kayaku Co., Ltd.

The aralkyl epoxy resin is represented by the following formula 2. Therein, X and Y represent aromatic rings such as a benzene ring, a naphthalene ring, and a biphenyl structure. Hydrogen in the aromatic rings of X and Y may be substituted. Examples of the substituent (s) include methyl, ethyl, propyl and phenyl groups. q represents recurring units, and the number of the units is not particularly limited.

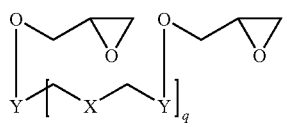

Specific examples of the aralkyl epoxy resin include, but are not limited to, formula 3 to 5.

First, the following formula 3 is given:

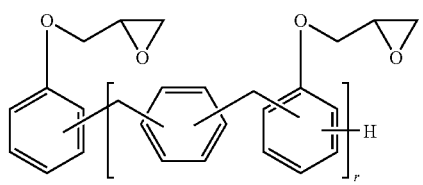

wherein r represents 1 to 5.

Particularly useful are epoxy resins containing an aromatic ring of a biphenyl structure in the molecule (formula 4):

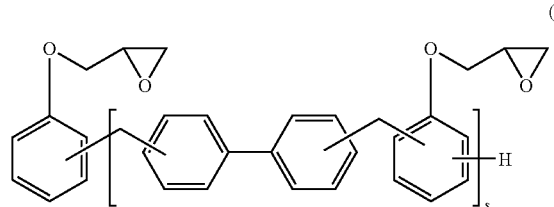

wherein s represents 1 to 5, and epoxy resins containing an aromatic ring of a naphthalene structure (formula 5):

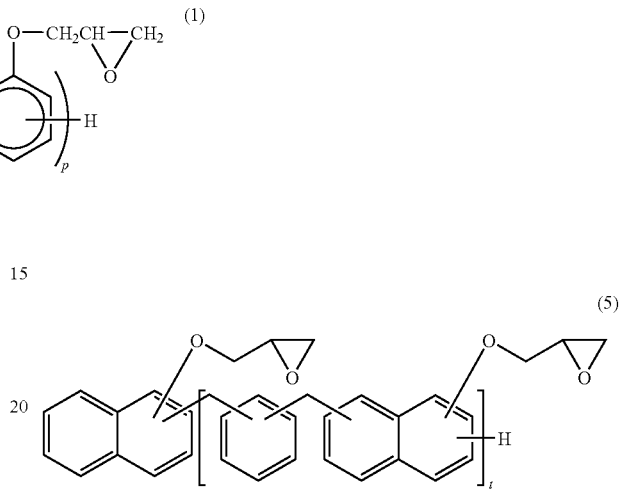

wherein t represents 1 to 5. This is because these are excellent in peeling strength of the metal foil, and heat resistance and thus they are effective.

These resins may be used alone or in the form of a mixture of two or more thereof. In the case of using the aralkyl epoxy resin, a different epoxy resin, such as a bisphenol A epoxy resin, a phenol novolak epoxy resin or a rubber modified epoxy resin can be used in an amount of 50% or less by weight of the total epoxy resin.

Examples of a commercially available product of the aralkyl epoxy resin include, but are not limited to, EXL-3L manufactured by Mitsui Chemicals, Inc., NC-3000S and NC-3000S-H manufactured by Nippon Kayaku Co., Ltd., and ESN-170 and ESN-480 manufactured by Nippon Steel Chemical Co., Ltd., the product being not limited to these examples.

A rubber modified epoxy resin may be contained as the component (A). The rubber modified epoxy resin can be used without any specific limitation if the resin is a product commercially available for adhesive or paint.

Examples of a commercially available product thereof include EPICLON TSR-960 manufactured by Dainippon Ink & Chemicals, Inc., and EPOTOHTO YR-102 and SUMIEPOXY ESC-500 manufactured by Tohto Chemical Industry Co., Ltd., the product being not limited to these examples.

The component (A) may contain the novolak epoxy resin and the rubber modified epoxy resin. The content of the rubber modified epoxy resin is preferably from 10 to 80% by weight of all of the epoxy resins. When the rubber modified epoxy resin is incorporated, the adhesive property to the metal foil surface subjected to no roughening treatment is improved. However, if the content is less than 10% by weight, the effect cannot be sufficiently exhibited. If the content is more than 80% by weight, the heat resistance is poor. The content is more preferably from 30 to 70% by weight.

Two or more kinds of the rubber modified epoxy resin may be used. The total amount thereof is in the above-mentioned range based on % by weight.

It is preferred that the adhesion assisting agent composition contains (B) a polymer which is able to be chemically roughened. Examples of the component (B) include cross-linked rubber particles, and polyvinyl acetal resin.

The cross-linked rubber particles are preferably of at least one kind selected from acrylonitrile butadiene rubber particles, carboxylic acid modified acrylonitrile butadiene rubber particles, and particles having a butadiene rubber core and an acrylic resin shell.

The acrylonitrile butadiene rubber particles are a material obtained by copolymerizing acrylonitrile and butadiene, cross-linking the resultant product partially at the stage of the copolymerization, and then making it into particles. The carboxylic acid modified acrylonitrile butadiene rubber particles can be obtained by copolymerizing the above together with a carboxylic acid such as acrylic acid or methacrylic acid. The particles having a butadiene rubber core and an acrylic resin shell can be obtained by two-stage polymerization, that is, polymerizing butadiene particles by emulsion polymerization and subsequently keeping on a polymerization of a monomer, such as an acrylic acid ester or acrylic acid. The size of the particles can be rendered a primary average particle size of 50 nm to 1 μm. These may be used alone or in combination of two or more thereof.

Examples of a commercially available product of the carboxylic acid modified acrylonitrile butadiene rubber particles include, but are not limited to, XER-91 manufactured by Japan Synthetic Rubber Co., Ltd., the product being not limited to these examples. Examples of a commercially available product of the particles having a butadiene rubber core and an acrylic resin shell include, but are not limited to, EXL-2655 manufactured by Rohm and Haas Japan and AC-3832 manufactured by Takeda Chemical Industries, Ltd., the product being not limited to these examples.

The polyvinyl acetal resin is preferably at least one selected from a polyvinyl acetal resin and a carboxylic acid modified polyvinyl acetal resin.

The kind of the polyvinyl acetal resins, the amount of hydroxyl groups therein, and the amount of acetyl groups therein are not particularly limited. The polymerization degree thereof is preferably from 1000 to 2500. If the polymerization degree is in this range, solder heat resistance can be ensured and the viscosity and handleability of the varnish are also good. The number-average polymerization degree of the polyvinyl acetal resin can be determined from, for example, the number-average molecular weight of polyvinyl acetate, which is a starting material thereof (the molecular weight being measured by use of a calibration curve of a standard polystyrene according to gel permeation chromatography). A carboxylic acid modified product or the like can be used.

Examples of the polyvinyl acetal species include, but are not limited to, S-LEC BX-1, BX-2, BX-5, BX-55, BX-7, BH-3, BH-S, KS-3Z, KS-5, KS-5Z, KS-8, and KS-23Z (trade names) manufactured by Sekisui Chemical Co., Ltd., and DENKABUTYRAL 4000-2, 5000A, 6000C and 6000EP manufactured by Denki Kagaku Kogyo Kabushiki Kaisha. The component (B) can be used alone or in the combination thereof.

It is preferred that the cross-linked rubber particles and the polyvinyl acetal resins are used together as the components (B), because the peeling strength of the metal foil and the peeling strength of the electroless plated film after chemically roughening are improved.

In the adhesion assisting agent composition, the amount of the component (B) is from 0.5 to 25 parts by weight for 100 parts by weight of the component (A). If the amount of the component (B) is less than 0.5 parts by weight, the peeling strength of metal foil or the peeling strength of the electroless plated film after chemically roughening tends to decrease. If the amount is more than 25 parts by weight, the solder heat resistance, the insulation reliability and others tend to decrease. In particular, it is much preferred that the amount of the cross-linked rubber particles and that of the polyvinyl acetal resin are each 1 or more parts by weight, since the peeling strength of the metal foil and the peeling strength of the electroless plated film after chemically roughening are improved. If only the coupling agent treatment is conducted without the incorporation of the component (B), the peeling strength is low.

The epoxy resin curing agent (C) is appropriately selected in accordance with the component (A). When the component (A) is, for example, a novolak epoxy resin, the component (C) preferably contains phenol novolak resin and more preferably contains a triazine-ring-containing phenol novolak resin. This is because the peeling strength of the metal foil and the peeling strength of the electroless plated film after chemically roughening are improved. When the component (A) is an aralkyl epoxy resin, it is preferred that an aralkyl resin having a phenolic hydroxyl group is contained as the component (C).

The triazine-ring-containing phenol novolak resin is a phenol novolak resin wherein the main chain of the phenol novolak resin contains a triazine ring, and may be a cresol phenol novolak resin containing a triazine ring. The nitrogen content in the triazine-ring-containing phenol novolak resin is preferably from 10 to 25% by weight, more preferably from 12 to 19% by weight. If the nitrogen content in the molecule is in this range, dielectric loss does not become very large. Additionally, when the adhesion assisting agent is made into varnish, the solubility thereof into a solvent is appropriate so that the remaining amount of undissolved products is restrained. The triazine-ring-containing phenol novolak resin which can be used preferably has a number-average molecular weight of 300 to 1000 and more preferably has a number-average molecular weight of 500 to 600. A single kind of this resin may be used, or a combination of two or more kinds thereof may be used.

The triazine-ring-containing phenol novolak resin can be obtained by causing phenol to react with an aldehyde and a triazine-ring-containing compound at a pH of 5 to 9. When a cresol is used instead of a phenol, a triazine-ring-containing cresol phenol novolak resin is prepared. As the cresol, any one of o-, m- and p-cresols can be used. As the triazine-ring-containing compound, there can be used melamin, guanamine and derivatives thereof, and cyanuric acid and derivatives thereof.

Examples of a commercially available product thereof include triazine-ring-containing cresol phenol novolak resins, PHENOLITE EXB-9829 (nitrogen content: 18% by weight) and LA-3018 (nitrogen content: 18% by weight), manufactured by Dainippon Ink & Chemicals, Inc., the product being not limited to these examples.

The aralkyl resin having a phenolic hydroxyl group is represented by the following formula 6. Therein, X and Y represent aromatic rings such as a benzene ring, a naphthalene ring, and a biphenyl structure. Hydrogen in the aromatic rings of X and Y may be substituted. Examples of the substituent include methyl, ethyl, propyl and phenyl groups. q represents recurring units, and the number of the units is not particularly limited.

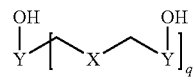

(6)

Specific examples of the aralkyl resin having a phenolic hydroxyl group include the following formula 7 to 9, the resin being not limited to these examples.

First, the following formula 7 is given:

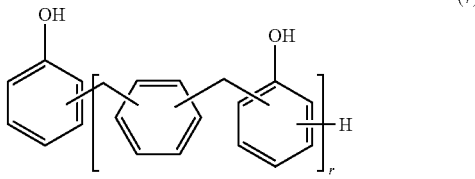

(7)

wherein r represents 1 to 5. Particularly preferred are phenol resins having in the molecule thereof an aromatic ring of a biphenyl structure (formula 8):

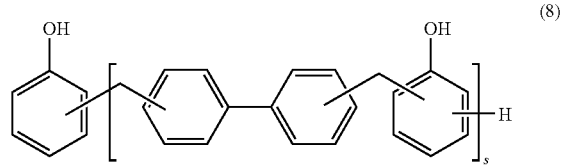

(8)

wherein s represents 1 to 5, and naphthol resins containing an aromatic ring of a naphthalene structure (formula 9):

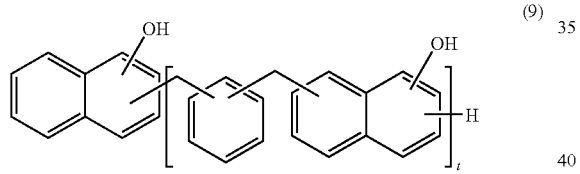

(9)

wherein t represents 1 to 5. This is because these are excellent in peeling strength of the metal foil, and heat resistance, and thus they are effective. These resins may be used alone or in the form of a mixture of two or more thereof. In the case of using the aralkyl resin as the component (C), it is allowable to use a different epoxy resin curing agent, for example, a bifunctional phenol such as bisphenol A, a phenol novolak resin, or an amino resin, together therewith in an amount of 50% or less by weight.

Examples of a commercially available product of the aralkyl resin having a phenolic hydroxyl group include XLC-3L manufactured by Mitsui Chemicals, Inc., HEM-7851 manufactured by Meiwa Chemical Industry Co., Ltd., and SN-170 and SN-480 manufactured by Nippon Steel Chemical Co., Ltd., the product being not limited to these examples.

It is preferred to use the aralkyl resin having a phenolic hydroxyl group together with the triazine-ring-containing novolak resin having a phenolic hydroxyl group as the components (C) since the peeling strength of the metal foil is improved. In the case that the added amount of the triazine-ring-containing novolak resin having a phenolic hydroxyl group is set into the range of 3 to 50% by equivalent of the epoxy resin curing agents, the peeling strength of the metal foil can be improved while the heat resistance is maintained. Thus, this case is more preferred.

The blend amount of the component (C) is preferably from 5 to 19% by weight of the total of the components (A) to (C), more preferably from 6 to 11% by weight thereof.

Furthermore, the adhesion assisting agent composition may contain (D) a reaction accelerator. As the component (D), any reaction accelerator may be used. Preferably, various imidazoles or $BF_3$ amine complexes, which are latent thermally curing agents, are incorporated thereinto. Preferred is 2-phenylimidazole, 2-ethyl-4-methylimidazole, or 1-cyano-ethyl-2-phenylimidazolium trimellitate from the viewpoint of the storage stability of the adhesion assisting agent, and the handleability when the composition is made into a B stage and the solder heat resistance.

The blend amount of the component (D) is preferably from 0.1 to 5 parts by weight, more preferably from 0.3 to 1 part by weight for 100 parts by weight of the epoxy resin (A) in the adhesion assisting agent. When the amount is in these ranges, sufficient solder heat resistance, good storage stability of the adhesion assisting agent, and good handleability when the composition is made into a B stage can be obtained.

Furthermore, the adhesion assisting agent may contain (E) a flame retardant in order to improve the flame resistance thereof. Bromine-based flame retardants and phosphorus-based flame retardants are known, and any flame retardant may be used as the component (E).

Preferred examples of the component (E) include phenolic-hydroxyl-containing phosphorus compounds represented by the following formula (10).

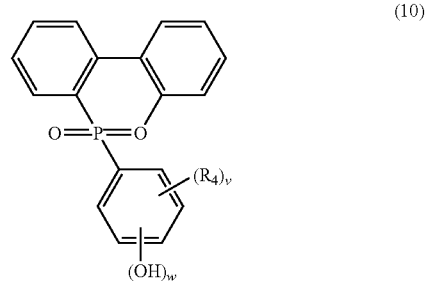

(10)

wherein when v is 1, R4 is a hydrogen atom, a linear or branched alkyl group, a cycloalkyl group, an aryl group or an aralkyl group; when v is 2, $R_4$s are each independently a hydrogen atom, a linear or branched alkyl group, a cycloalkyl group, an aryl group or an aralkyl group, or two $R_4$s are combined with the carbon atom to which $R_4$s are each bonded, so as to form an unsubstituted benzene ring or an alkyl- or cycloalkyl-substituted benzene ring; and w is a natural number of 2 or more. These may be used alone or in combination of two or more thereof.

When $R_4$ is a linear or branched alkyl group in the formula (10), the group is preferably a $C_1$-$C_6$ alkyl group. When $R_4$ is a cycloalkyl group, the group is preferably a $C_6$-$C_8$ cycloalkyl group. When $R_4$ is an aryl group, the group is preferably a phenyl group. When $R_4$ is an aralkyl, the group is preferably a $C_7$-$C_{10}$ aralkyl group. w is preferably 2. When v is 2 and two $R_4$s are combined with the carbon atom to which $R_4$s are each bonded, so as to form an unsubstituted benzene ring or an alkyl- or cycloalkyl-substituted benzene ring in the formula (10), the formed ring is preferably an unsubstituted benzene ring or a $C_1$-$C_4$ alkyl- or $C_6$-$C_8$ cycloalkyl-substituted benzene ring.

Specific examples thereof include phosphorus compounds represented by the following formula (11) or (12):

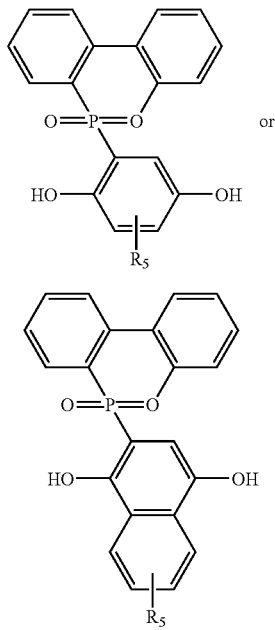

wherein $R_5$ represents a hydrogen atom, or a methyl, ethyl, n-propyl, isopropyl, n-butyl, isobutyl, sec-butyl, tert-butyl or cyclohexyl group.

Particularly preferred are 10-(2,5-dihydroxyphenyl)-9,10-dihydro-9-oxa-10-phosphaphenanthlene-10-oxide and derivatives thereof.

Examples of a commercially available product of the phosphorus-based flame retardant include FX-305 manufactured by Tohto Chemical Industry Co., Ltd., and HCA-HQ manufactured by Sanko Co., Ltd., the product being not limited to these examples.

When the component (A) of the adhesion assisting agent composition is made mainly of a novolak epoxy resin and the flame retardant (E) is a phenolic-hydroxyl-containing phosphorus compound, the blend amount of the component (E) is preferably from 1.5 to 3.5% by weight, more preferably from 1.8 to 2.5% by weight of the total of the components (A) to (D), the blend amount being an amount in terms of phosphorus atoms. When the blend amount is in this range, the frame resistance is good, the insulation reliability is excellent and the Tg of the cured coating film is not very low.

When the component (A) of the adhesion assisting agent is mainly composed of an aralkyl epoxy resin, the blend amount of the component (E) is preferably from 1.0 to 10% by weight of the total of the components (A) to (E) plus (F) an inorganic filler, which will be described later, the blend amount being an amount in terms of bromine atoms. The blend amount of the component (E), the amount being an amount in terms of phosphorus atoms, is preferably from 1.0 to 3.5% by weight thereof.

The adhesion assisting agent composition may contain (F) an inorganic filler to improve the reliability thereof.

Examples of the component (F) include silica, fused silica, talc, alumina, aluminum hydroxide, barium sulfate, calcium hydroxide, aerosil, and calcium carbonate, the component (F) being not limited to these examples. Examples of the component (F) also include products obtained by treating these with various coupling agents such as a silane coupling agent and thus making the dispersibility thereof high. These may be used alone or in combination of two or more thereof. Silica is preferred from the viewpoint of the dielectric property and low thermal expansion thereof.

When the component (A) mainly comprises novolak epoxy resin, the blend amount of the component (F) is preferably from 5 to 35% by volume, more preferably from 10 to 30% by volume of the total of the components (A) to (E). When the component (A) mainly comprises an aralkyl epoxy resin, the blend amount thereof is preferably from 5 to 35% by volume, more preferably from 10 to 30% by volume. When the blend amount is in this range, the thermal expansion coefficient and dielectric loss do not become large and further sufficient flowability for forming an insulating layer on an inner layer circuit is obtained. In order to disperse the inorganic filler into the adhesion assisting agent of the present invention, a known kneading manner by using a kneader, a ball mill, a bead mill, a three-axial roller or the like can be used.

If necessary, additives, such as a pigment, a leveling agent, an antifoamer and an ion trapping agent, may be incorporated into the adhesion assisting agent composition.

The adhesion assisting agent produced as described above is diluted with a solvent so as to prepare a varnish. The varnish is applied onto a copper foil. Examples of the solvent include ketones such as acetone, methyl ethyl ketone and cyclohexanone, aromatic hydrocarbons such as benzene, xylene and toluene, alcohols such as ethylene glycol monoethyl ether, esters such as ethylethoxypropionate, and amides such as N,N-dimethylformamide and N,N-dimethylacetoamide, the solvent being not limited to these examples. These solvents may be used alone or in the form of a mixture of two or more thereof. The amount of the solvent used for the adhesion assisting agent is not particularly limited, and may be an amount that has been hitherto used.

The adhesion assisting agent composition or the varnish is applied onto a single face of a metal foil, and then semi-cured, thereby an adhesion assisting agent fitted metal foil is completed.

When the adhesion assisting agent composition is made into a varnish and the varnish is applied onto a metal foil with a comma coater or a gravure coater, it is preferred to adjust the amount of the solvent in such a manner that the amount of all solid contents in the adhesion assisting agent is in the range of 10 to 30% by weight. The amount may be adjusted to matched with film-forming equipment.

A substrate using an adhesion assisting agent fitted metal foil as described above can be obtained by laminating/integrating the adhesion assisting agent fitted metal foil on/with a prepreg in a manner known in the prior art so as to make the adhesion assisting agent layer of the adhesion assisting agent fitted metal foil opposite to the prepreg. According to the process described above, a laminated board composed of the two layers is completed. Circuits are formed thereon by a known method, thereby a printed-wiring board is yielded.

When the laminated board produced as described above is rendered an inner layer board, it is desired for the formability and electrical characteristics of a fine circuit that the surface roughness Rz of its conductor circuit is 2.0 μm or less and the surface roughness Rz of the insulating layer of the inner layer substrate is 2.0 μm or less.

Furthermore, a multi-layered prepreg and adhesion assisting agent fitted metal foils are stacked and then a multilayer and a circuit are formed by a known method, whereby a multi-layered printed-wiring board can be yielded. It is desired for electrical characteristics that the surface roughness Rz of a conductor circuit of the multi-layered printed-wiring board produced as described above is 2.0 μm or less and the surface roughness Rz of the insulating layer of its inner substrate is 2.0 μm or less.

The following will describe an example of a process for producing a substrate wherein an adhesion assisting agent fitted metal foil as described above is used. The adhesion assisting agent fitted metal foil and a prepreg are laminated/integrated on/with each other by a method known in the prior art, whereby a laminated board can be yielded. FIG. 1(a) illustrates a laminated board comprising a prepreg 1, a metal foil 2 and an adhesion assisting agent layer 3.

With reference to FIG. 1, an embodiment of the present invention will be described in detail hereinafter.

First, a core substrate is produced. The method for producing the core substrate is not particularly limited in the present invention. The core substrate referred to in the invention is a substrate wherein wiring, which is an intermediate for producing a substrate, is formed. The following will describe an example of the method for forming fine wiring on the core substrate. The core substrate is a product composed of an insulating layer and a metal layer. In the case of producing this, preferred is a method of forming a laminated board having the metal layer 2 over both sides of the prepreg 1 as illustrated in FIG. 1(a) since the method is inexpensive. The adhesion assisting agent layer 3 of the adhesion assisting agent fitted metal foil is arranged to direct toward the prepreg 1.

The prepreg is a product obtained by the impregnation with or application of an insulating resin composition of or onto a substrate. As the substrate, a well-known substrate used in various laminated boards for electrically insulating material can be used. Examples of the material of the substrate include inorganic fiber made of E glass, D glass, S glass or Q glass; organic fiber made of polyimide, polyester or tetrafluoroethylene; and mixtures thereof.

These substrates have a form of a woven cloth, a nonwoven cloth, a roving, a chopped strand mat, a surfacing mat or the like. The material and the shape of the substrate are selected in accordance with the usage or performance of a target molded product and, if necessary, two or more materials or shapes can be used. The thickness of the substrate is not particularly limited. Usually, a substrate having a thickness of about 0.03 to 0.5 mm can be used. Preferred is a substrate surface-treated with a silane coupling agent or a substrate subjected to mechanical fiber-untangling treatment from the viewpoint of heat resistance, humidity resistance and workability.

The insulating resin composition which can be used may be a known and conventional resin composition used as an insulating material for a printed-wiring board. Usually, a thermosetting resin good in heat resistance and chemical resistance is used as a base thereof. Examples of the thermosetting resin include a phenol resin, an epoxy resin, a cyanate resin, a maleimide resin, an isocyanate resin, a cyanate ester resin, a benzocyclobutene resin, and a vinyl resin, the resin being not limited to these examples. The thermosetting resins may be used alone or in the form of a mixture of two or more thereof.

Of the thermosetting resins, the epoxy resin is widely used as an insulating resin since the resin is relatively inexpensive and is excellent in heat resistance, chemical resistance and electrical characteristics. Examples of the epoxy resin include bisphenol epoxy resins such as a bisphenol A epoxy resin, a bisphenol F epoxy resin, a bisphenol S epoxy resin; novolak epoxy resins such as a phenol novolak epoxy resin, a cresol novolak epoxy resin, and a bisphenol A novolak epoxy resin; alicyclic epoxy resins; aliphatic linear epoxy resins; diglycidyl-etherized products of biphenol; diglycidyl-etherized products of naphthalenediol; diglycidyl-etherized products of phenolic compounds; diglycidyl-etherized products of alcohols; and alkyl-substituted products, halogenated products and hydrogenated products thereof, the resin being not limited to these examples. The epoxy resins may be used alone or in the form of a mixture of two or more thereof. The curing agent used together with the epoxy resin(s) can be used without any restriction if the agent is an agent for causing the epoxy resin(s) to be cured. Examples of the curing agent include polyfunctional phenols, polyfunctional alcohols, amines, imidazole compounds, acid anhydrides, organic phosphorus compounds, and halogenated products thereof, the curing agent being not limited to these examples. These curing resins may be used alone or in the form of a mixture of two or more thereof.

The cyanate ester resin is a resin obtained by producing a cured product having triazine rings as recurring units by heating. The cured product is frequently used in cases where high frequency property is particularly required since the cured product is excellent in dielectric property. Examples of the cyanate ester resin include 2,2-bis(4-cyanatophenyl)propane, bis(4-cyanatophenyl)ethane, 2,2-bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, and cyanate esterified products of phenol novolak and alkylphenol novolak. Of these, 2,2-bis(4-cyanatophenyl)propane is preferred since balance between the dielectric property of the cured product thereof and the curability thereof is particularly good and the cost thereof is also low. The cyanate ester compounds may be used alone or in the form of a mixture of two or more thereof. A part thereof may be beforehand made into an oligomer such as a trimer or a pentamer. Moreover, a curing catalyst or a curing accelerator may be incorporated into the cyanate resin. Examples of the curing catalyst include metals such as manganese, iron, cobalt, nickel, copper and zinc, the catalyst being not limited to these examples. Specifically, the metals may be used as organic metal salts such as 2-ethylhexanoic acid salts, naphthenic acid salts, octanoic acid salts, and organic metal complexes such as acetylacetone complexes. These may be used alone or in the form of a mixture of two or more thereof. As the curing accelerator, a phenolic compound is preferably used, and the following can be used: monofunctional phenols such as nonylphenol and p-cumylphenol; bifunctional phenols such as bisphenol A, bisphenol F and bisphenol S; and polyfunctional phenols such as phenol novolak and cresol novolak. These may be used alone or in the form of a mixture of two or more thereof.

A thermoplastic resin may be blended with the resin composition used as the insulating material, considering the dielectric property, impact resistance, film-formability and other properties thereof. Examples of the thermoplastic resin include fluorine-containing resin, polyphenylene ether, modified polyphenylene ether, polyphenylene sulfide, polycarbonate, polyetherimide, polyetheretherketone, polyarylate, polyamide, polyamideimide, and polybutadiene, the resin being not limited to these examples. The thermoplastic resins may be used alone or in the form of a mixture of two or more thereof.

Of the thermoplastic resins, polyphenylene ether and modified polyphenylene ether are useful since the dielectric property of the cured product is improved when the ethers are incorporated thereinto. Examples of the polyphenylene ether and modified polyphenylene ether include poly(2,6-dimethyl-1,4-phenylene) ether, a polymer alloy of poly(2,6-dimethyl-1,4-phenylene)ether and polystyrene, a polymer alloy of poly(2,6-dimethyl-1,4-phenylene)ether and styrene-butadiene copolymer, a polymer alloy of poly(2,6-dimethyl-1,4-phenylene)ether and styrene-maleic anhydride copolymer, a polymer alloy of poly(2,6-dimethyl-1,4-phenylene)ether and polyamide, and a polymer alloy of poly(2,6-dimethyl-1,4-phenylene)ether and styrene-butadiene-acrylonitrile copolymer, the ethers being not limited to these examples. In order to give reactivity or polymerizability to the polyphenylene ether, it may introduce, into a polymer chain terminal thereof, a functional group such as an amino, epoxy, carboxyl, styryl or methacryl group, or introduce, into a side chain of the polymer chain thereof, a functional group such as an amino, epoxy, carboxyl, styryl or methacryl group.

Of the thermoplastic resins, polyamideimide resin is useful since the resin is excellent in heat resistance and humidity resistance and is also good in adhesive property to metal. As starting materials of the polyamideimide, an acid component and an amine component are used. Examples of the acid include trimellitic anhydride and trimellitic anhydride monochloride, the component being not limited to these examples. Examples of the amine component include m-phenylenediamine, p-phenylenediamine, 4,4'-diaminodiphenyl ether, 4,4'-diaminodiphenylmethane, bis[4-(aminophenoxy)phenyl]sulfone, and 2,2'-bis[4-(4-aminophenoxy)phenyl]propane, the component being not limited to these examples. The polyamideimide resin may be modified with siloxane in order to improve the drying property thereof. In this case, siloxanediamine is used as the amino component. Considering film-formability, a resin having a molecular weight of 50,000 or more is preferably used.

An inorganic filler may be mixed with the resin composition used as the insulating material.

Examples of the inorganic filler include alumina, aluminum hydroxide, magnesium hydroxide, clay, talc, antimony trioxide, antimony pentaoxide, zinc oxide, fused silica, glass powder, quartz powder, and shirasu (volcanic sand) balloons, the filler being not limited to these examples. These inorganic fillers may be used alone or in the form of a mixture of two or more thereof.

The resin composition used as the inorganic material may contain an organic solvent. Examples of the organic solvent include aromatic hydrocarbon solvents such as benzene, toluene, xylene and trimethylbenzene; ketone solvents such as acetone, methyl ethyl ketone and methyl isobutyl ketone; ether solvents such as tetrahydrofuran; alcohol solvents such as isopropanol and butanol; ether alcohol solvents such as 2-methoxyethanol and 2-butoxyethanol; and amide solvents such as N-methylpyrrolidone, N,N-dimethylformamide and N,N-dimethylacetoamide, the solvent being not limited to these examples. When a prepreg is formed, the amount of the solvent in the varnish therefor is preferably from 40 to 80% by weight. At this time, the viscosity of the varnish is preferably set into the range of 20 to 100 cP.

The resin composition used as the insulating material may contain a flame retardant. As the flame retardant, a known flame retardant can be used. Specific examples thereof include bromine compounds such as decabromodiphenyl ether, tetrabromobisphenol A, tetrabromophthalic anhydride, and tribromophenol; phosphorus compounds such as triphenyl phosphate, tricresyl phosphate, trixylyl phosphate, and cresyldiphenyl phosphate; metal hydroxides such as magnesium hydroxide and aluminum hydroxide; red phosphorus and modified products thereof; antimony compounds such as antimony trioxide and antimony pentaoxide; and triazine compounds such as melamine, cyanuric acid and melamine cyanurate, the flame retardant being not limited to these examples.

If necessary, the resin composition used as the insulating material may contain a filler or various additives such as a curing agent, a curing accelerator, thermoplastic particles, a coloring agent, an ultraviolet impermeable agent, an antioxidant and a reductant.

Usually, a substrate is impregnated with the resin composition or the resin composition is coated onto a substrate in such a manner that the amount of the resin composition adhering to the substrate becomes 20 to 90% by weight, this amount being the resin content by percentage in a prepreg obtained after drying. Thereafter, the resultant is heated and dried ordinarily at a temperature from 100 to 200° C. for 1 to 30 minutes, thereby yielding a prepreg in a semi-cured state (a B stage state). The prepreg(s), the number of which is usually from 1 to 20, is/are stacked, and a structure where metal foil pieces are arranged on both faces of the resultant is heated and pressed. A manner for ordinary laminated boards can be applied to conditions for the molding thereof. For example, multi-stage press, multi-stage vacuum press, continuous molding, an autoclave molding machine, or the like may be used. Usually, the molding is performed at a temperature from 100 to 250° C. and a pressure from 2 to 100 kg/cm$^2$ for a heating time of 0.1 to 5 hours, or under conditions of from 50 to 150° C. and from 0.1 to 5 MPa in a reduced pressure or the atmospheric pressure. The thickness of the prepreg layer, which becomes an insulating layer, is varied in accordance with the usage. Usually, the thickness is preferably from 0.1 to 5.0 mm.

Next, a through hole 4 for interlaminar connection is made in the above-mentioned laminate (FIG. 1(b)). When the through hole diameter is 100 μm or more, working with a drill is appropriate. When the through hole diameter of 100 μm or less, a gas laser from $CO_2$, CO, an excimer or the like, or a solid laser from YAG or the like is appropriate. When the through hole diameter is about 100 μm, either of them may be used.

Next, catalyst nuclei are supplied onto the metal foil and into the through hole (not illustrated). For the supply of the catalyst nuclei, there may be used, for example, a palladium ion catalyst, ACTIVATOR NEOGANT (trade name, manufactured by Atotech Japan), or a palladium colloid catalyst, HS201B (trade name, manufactured by Hitachi chemical Co., Ltd.). When the palladium catalyst is supplied, conditioning treatment, such as CLC-201 (trade name, manufactured by Hitachi Chemical Co., Ltd.), is beforehand conducted.

Next, as illustrated in FIG. 1(c), a thin electroless plating layer 5 is formed on the metal foil and the inside of the through hole, to which the catalyst nuclei are supplied. For the electroless plating, commercially available electroless copper plating can be used, examples of which include CUST 2000 (trade name, manufactured by Hitachi Chemical Co., Ltd.) and CUST 201 (trade name, manufactured by Hitachi Chemical Co., Ltd.). These electroless copper platings are each made mainly of copper sulfate, formalin, a complexation agent, and sodium hydroxide. It is sufficient that the thickness of the plating is a thickness making it possible to attain subsequent electroplating and is from about 0.1 to 1 μm. The electroless copper plating can be omitted if no interlaminar connection is required.

Next, as illustrated in FIG. 1(d), a plating resist 6 is formed on the electroless plating. The thickness of the plating resist is preferably set to a film thickness equivalent to or larger than the thickness of a conductor formed by subsequent plating. Examples of the resin which can be used for the plating resist include liquid resists such as PMER P-LA900PM (trade name, manufactured by Tokyo Ohka Kogyo Co., Ltd.), and dry films such as HW-425 (trade name, manufactured by Hitachi Chemical Co., Ltd.) and RY-3325 (trade name, manufactured by Hitachi Chemical Co., Ltd.). The plating resist is neither formed on via holes nor sites which should become a conductor circuit.

Next, as illustrated in FIG. 1(e), a circuit pattern 7 is formed by electroplating. For the electroplating, copper sulfate electroplating, which is usually used for printed-wiring boards, can be used. It is sufficient that the thickness of the plating is a thickness which makes the use as a circuit conductor possible. The thickness is preferably from 1 to 100 μm, more preferably from 5 to 50 μm.

Next, as illustrated in FIG. 1(f), an alkaline removing solution, sulfuric acid, or a commercially available resist-removing solution is used to remove the resist, and then the copper in areas other than the pattern area is etched and removed. In this case, the etching is generally performed with a high-pressure spray or the like. However, in fine portions of the wiring, solution-exchange inevitably goes wrong. It is therefore desired that the reaction of the copper with the etching solution is not based on diffusion control but on reaction control. When the reaction of the copper with the etching solution is based on reaction control, the etching rate does not change even if diffusion is further enhanced. In other words, an etching rate difference is not generated very much between the place where the solution-exchange goes well and the place where it goes wrong. Specifically, it is preferred to use an etching solution made mainly of hydrogen peroxide and an acid which does not contain any halogen. When hydrogen peroxide is used as an oxidizer, strict control of the etching rate can be attained by controlling the concentration of hydrogen peroxide. When a halogen element gets mixed with the etching solution, the reaction for dissolution therewith is easily subjected to diffusion control. As the acid containing no halogen, nitric acid, sulfuric acid, an organic acid, or the like can be used. Sulfuric acid is preferred since it is inexpensive. When the etching solution is made mainly of sulfuric acid and hydrogen peroxide, it is preferred that the concentrations thereof are in the ranges of 5 to 300 g/L and 5 to 200 g/L, respectively, from the viewpoint of the etching rate and the stability of the solution.

The above has described the substrate-producing process by pattern electroplating. A subtractive method may be used. Through the above-mentioned process, a core substrate composed of the two layer is completed. It is preferred from the viewpoint of electrical characteristics that the surface roughness Rz of the conductor circuit in the core substrate produced as described above is 2.0 μm or less and the surface roughness Rz of the insulating layer of the core substrate is 2.0 or less.

In the smooth conductor circuit and insulating layer formed as described above, an anchor effect is not expected. It is therefore preferred from the viewpoint of reliability that, as illustrated in FIG. 1(g), an adhesion assisting agent layer 8 for promoting adhesive property is formed. The thickness of the adhesion assisting agent layer is preferably from 0.1 to 10 μm, more preferably from 0.1 to 5 μm. If the thickness of the adhesion assisting agent layer is less than 0.1 μm, the adhesive property may be insufficient. If the thickness is more than 10 μm, effects may be produced on the elongation percentage, the dielectric constant, the dielectric loss tangent, and other characteristics. The adhesion assisting agent may be made of the same resin as applied on the copper foil.

When rust preventing treatment, such as nickel, chromium, tin, zinc, palladium or oxide thereof, and treatment with a coupling agent are applied onto the conductor circuit and then the adhesion assisting agent layer is formed on the resultant, large effect is obtained. The method for conducting the rust preventing treatment or the coupling agent treatment may be the same as in the case of applying the treatments to the copper foil. The rust preventing treatment is preferably conducted by electroless plating.

In the film-forming method for the adhesion assisting agent layer composition, the core substrate is immersed into an adhesion assisting agent solution. Before the immersion, the core substrate is immersed into an acid, an alkali or various surfactant solutions, whereby its oxide layer can be removed or the wettability can be improved. It is desired that the surface roughness Rz of the treated conductor circuit is 2.0 μm or less. The solid content concentration in the adhesion assisting agent composition is not particularly limited, and it is desirably from 1 to 50%, more preferably desirably from 3 to 25%, considering the resin thickness after the immersion. It is sufficient that the adhesion assisting agent treating temperature is room temperature. The temperature of the solution may be controlled in the range of 10 to 50° C.

After the immersion, the substrate is dried by hot-wind blow or the like. The drying temperature is desirably from 90 to 210° C., more desirably from 120 to 190° C. After the drying, the amount of the remaining solvent should be set to 1% or less. If the amount of the remaining solvent is over 1%, the reliability of a finally-produced printed-wiring board deteriorates. The drying time is varied in accordance with the drying temperature or the like, and is preferably from 1 to 60 minutes. The dried resin is not completely cured but is made into a B stage state, which is a semi-cured state. If the resin is completely cured, the adhesive force between the resin and the insulating layer laminated thereon may become weak.

Next, as illustrated in FIG. 1(h), a single-side metal-foil-fitted resin comprising an insulating layer 9 and a metal layer 10 is laminated on the core substrate treated with the adhesion assisting agent. An adhesion assisting agent layer 11 may be formed between the insulating layer 9 and the metal layer 10. The thickness of the insulating layer is desirably from about 10 to 100 μm, more desirably from 20 to 60 μm. The thickness of the metal foil 10 is preferably from 0.3 to 35 μm. The resin composition and the copper foil for the single-side metal-foil-fitted resin may be the same as used in the case of the laminated board, and the formation is performed by applying a resin varnish onto a metal foil with a kiss coater, a roll coater, a comma coater or the like, or laminating a film-form resin onto a metal foil. In the case of applying a resin varnish onto a metal foil, the resultant is subsequently heated and dried. As the conditions at this time, a temperature from 100 to 200° C. and a time from 1 to 30 minutes are appropriate. The amount of the remaining solvent in the heated and dried resin composition is appropriately from about 0.2 to 10%. In the case of laminating a film-form resin onto a metal foil, conditions of from 50 to 150° C. and from 0.1 to 5 MPa in a vacuum or in the atmosphere are appropriate. When an epoxy resin is incorporated into the insulating layer, the adhesive property thereof to B-stage polyamideimide is improved. There is also a method of laminating a prepreg and a copper foil onto the core substrate and then pressing the resultant. The prepreg used in this case is formed in the same way as in the case of the core substrate. As for the peeling strength between the adhesion assisting agent layer and the copper foil, the peeling strength between the adhesion assisting agent fitted insulating layer and the conductor circuit which has a width of 1 mm is preferably 0.6 kN/m or more at 20° C. The adhesion assisting agent fitted insulating layer means an insulating layer onto which the adhesion assisting agent layer of the adhesion assisting agent fitted metal foil adheres, that is, a product where the adhesion assisting agent of the adhesion assisting agent fitted metal foil and the insulating layer are arranged to be adjacent to each other. The peeling strength between the adhesion assisting agent fitted insulating layer and the 1-mm width conductor circuit is more preferably 0.4 kN/m or more at 20° C. after they are heated at 150° C. for 240 hours.

Next, as illustrated in FIG. 1(*i*), an IHV 12 is made from the upper face of the metal foil into the interlaminar insulating layer. The use of a laser is suitable as the method for making the IVH. The laser used therein may be a gas laser from $CO_2$, CO, an excimer or the like, or a solid laser from YAG or the like. The $CO_2$ laser is suitable for work for the IHV having a diameter of 50 μm or more since a large power can easily be obtained. When a fine IVH having a diameter of 50 μm or less is worked, the YAG laser, which has a short wavelength and a good beam-condensing property, is suitable.

For the formation of the IVH, the conformal method can be used. The conformal method is a method of making windows in a copper foil by photolithography, and making an IVH by use of a laser diameter larger than the window. When the window is made by photolithography, it is generally difficult to form a resist on the edge portion of a substrate. Accordingly, a place where the resin in the edge portion is naked is generated. In this case, the adhesion assisting agent composition is used, thereby improving plating adhesive property onto the place where the resin is naked (the substrate edge portion) Consequently, an inconvenience that plating is peeled from the substrate edge portion is not easily caused.

There is also known the large window method of making a window larger than an IVH diameter in a copper foil by photolithography, and then making an IVH with a laser having a diameter equal to the IVH diameter. When the adhesion assisting agent composition is used in this case, plating adhesive property is improved in the substrate edge portion where the resin is naked, which is a problem of the conformal method, and further in the large window portion, around the IVH diameter, where the resin is naked. Consequently, an inconvenience of plating peeling is not easily caused.

Next, an oxidizer such as a permanganate, a chromate, or chromic acid is used to remove resin residues inside the IVH. Next, catalyst nuclei are supplied onto the metal foil and the inside of the IVH. In the present invention, at the same time when the resin residues inside the IVH are removed, the place where the resin is naked can be roughened. Accordingly, plating adhesive property is improved in a subsequent plating step.

Next, as illustrated in FIG. 1(*j*), a thin electroless plating layer 13 is formed on the metal foil and the inside of the IVHs, to which the catalyst nuclei are supplied. For the electroless plating, a commercially available electroless copper plating can be used. Examples of the commercially available electroless copper plating include CUST 2000 (trade name, manufactured by Hitachi Chemical Co., Ltd.) and CUST 201 (trade name, manufactured by Hitachi Chemical Co., Ltd.). These electroless copper platings are each made mainly of copper sulfate, formalin, a complexation agent, and sodium hydroxide. It is sufficient that the thickness of the plating is a thickness making it possible to attain subsequent electroplating and is from about 0.1 to 1 μm.

Next, as illustrated in FIG. 1(*k*), a plating resist 14 is formed on the electroless plating. The thickness of the plating resist is preferably set to a film thickness equivalent to or larger than the thickness of a conductor formed by subsequent plating. Examples of the resin which can be used for the plating resist include liquid resists such as PMER P-LA900PM (trade name, manufactured by Tokyo Ohka Kogyo Co., Ltd.), and dry films such as HW-425 (trade name, manufactured by Hitachi Chemical Co., Ltd.) and RY-3325 (trade name, manufactured by Hitachi Chemical Co., Ltd.), examples of the resin being not limited to these examples. The plating resist is neither formed on via holes nor sites which should become a conductor circuit.

Next, as illustrated in FIG. 1(*l*), a circuit pattern 15 is formed by electroplating. For the electroplating, copper sulfate electroplating, which is usually used for printed-wiring boards, can be used. It is sufficient that the thickness of the plating is a thickness which makes the use thereof as a circuit conductor possible. The thickness is preferably from 1 to 100 μm, more preferably from 5 to 50 μm.

Next, the resist is removed, using an alkaline removing solution, sulfuric acid, or a commercially available resist-removing solution.

Next, the copper in areas other than the pattern area is removed with an etching solution, so that the formation of the circuit is finished (FIG. 1(*m*)). Such an etching solution is preferably made mainly of 10 to 300 g/L of sulfuric acid and 10 to 200 g/L of hydrogen peroxide.

Furthermore, electroless gold plating is applied onto the circuit to form a gold plating layer 16 (FIG. 1(*n*)). As the method for the gold plating, the following is performed: the surface of the conductor is subjected to activating treatment with an activating treatment solution such as SA-100 (trade name, manufactured by Hitachi Chemical Co., Ltd.); the resultant is subjected to electroless nickel plating with NIPS-100 (trade name, manufactured by Hitachi Chemical Co., Ltd.) or the like to give a thickness of about 1 to 10 μm; the resultant is subjected to gold displacement plating with HGS-100 (trade name, manufactured by Hitachi Chemical Co., Ltd.) to give a thickness of about 0.01 to 0.1 μm; and subsequently the resultant is subjected to electroless gold plating with HGS-2000 (trade name, manufactured by Hitachi Chemical Co., Ltd.) to give a thickness of about 0.1 to 1 μm. As disclosed in JP-A No. 11-140659, electroless palladium plating may be conducted between electroless nickel plating and electroless gold plating. According to this, connection reliability is further improved. As the electroless palladium plating, PALLET (trade name, manufactured by Kojima Chemical Reagents Inc.) or the like is performed to give a thickness of about 0.01 to 1 μm. In the case of considering electrical characteristics, the electroless nickel plating may be omitted. The combination of these is varied in accordance with the usage of the product, and is decided under consideration of costs, electrical characteristics and connection reliability thereof. The present invention is useful when either of the methods is used.

EXAMPLES

Example I-1

The following metal foil AI was formed.
(Metal Foil AI)
A glossy face of an electrodeposited copper foil (carrier copper foil) of 510 mm width and 35 μm thickness was continuously plated with chromium to form a chromium plating layer (peelable layer) of 1.0 mg/dm² thickness. After the formation of the chromium plating, the surface roughness Rz was 0.5 μm. The surface roughness was measured on the basis of JIS-B-0601.
Chromium Plating Conditions
Solution composition: chromium trioxide, 250 g/L; and sulfuric acid, 2.5 g/L
Bath temperature: 25° C.
Anode: lead
Current density: 20 A/cm²

Copper electroplating was conducted to give a thickness of 2.0 μm under glossy plating conditions described below. After the end of the copper electroplating, the metal foil surface roughness Rz was 0.6 μm.

Copper Sulfate Plating Conditions
Solution composition: copper sulfate tetrahydrate, 100 g/L; sulfuric acid, 150 g/L; and chloride ions, 30 ppm
Bath temperature: 25° C.
Anode: lead
Current density: 10 A/dm$^2$ Next, rust preventing treatment with zinc was conducted by electroplating, as described blow.
Solution composition: zinc, 20 g/L; and sulfuric acid: 70 g/L
Bath temperature: 40° C.
Anode: lead
Current density: 15 A/dm$^2$
Electrolyzing time: 10 seconds Next, the following chromate treatment was conducted:
Solution composition: chromic acid; 5.0 g/L
pH: 11.5
Bath temperature: 55° C.
Anode: lead
Immersing time: 5 seconds Next, the following silane coupling treatment was conducted:
Solution composition: 3-aminopropyltrimethoxysilane, 5.0 g/L
Solution temperature: 25° C.
Immersing time: 10 seconds After the silane coupling treatment, the metal foil was dried at 120° C. to cause the coupling agent to be adsorbed on the metal foil surface. At this time, the metal foil surface roughness Rz was 0.6 μm.

A resin composition AI having the following composition was prepared. The resin composition AI would be used later as an adhesion assisting agent layer composition.

(Resin Composition AI)
Novolak epoxy resin having a biphenyl structure, NC3000S-H (manufactured by Nippon Kayaku Co., Ltd.): 65 parts by weight
Carboxylic acid modified acrylonitrile butadiene rubber particles, XER-91SE-15 (manufactured by JSR Corp.): 5 parts by weight
Carboxylic acid modified polyvinyl acetal resin, KS-23Z (manufactured by Sekisui Chemical Co., Ltd.): 10 parts by weight
Triazine-ring-containing cresol phenol novolak resin, PHENOLITE EXB-9829 (manufactured by Dainippon Ink & Chemicals, Inc.; nitrogen content: 18% by weight, and hydroxyl equivalent: 151): 20 parts by weight
Imidazole derivative compound, 1-cyanoethyl-2 phenylimidazolium trimellitate, 2PZ-CNS (manufactured by Shikoku Chemicals Corp.): 0.3 part by weight
Solvent, methyl ethyl ketone The following metal foil BI was produced.
(Metal Foil BI)
The resin composition AI was applied onto the silane coupling agent treated face of the resultant metal foil AI. After the application, the resultant was dried at 160° C. for about 10 minutes in such a manner that the concentration of the remaining solvent was 5% or less, thereby producing a metal foil BI, which was an adhesion assisting agent fitted metal foil. The thickness of the applied resin composition AI was 3.0 μm after it was dried.

Next, pieces of the metal foil BI were laminated on the upper and lower faces of four, high Tg epoxy resin prepregs GEA-679F (thickness: 0.1 mm) manufactured by Hitachi Chemical Co., Ltd. in such a manner that the resin composition AI of the metal foil BI was brought into contact with the prepregs. This was press-formed at 180° C. and 2.5 MPa for 1 hour, and then the carrier foil piece on each of the copper foil pieces was peeled, thereby producing a copper-clad laminated board as illustrated in FIG. 1(a), which was composed of a prepreg 1, an adhesion assisting agent layer 3 and a metal foil 2.

As illustrated in FIG. 1(b), through holes 4 having a diameter of 80 μm were made from the upper face of the metal foil with a carbon dioxide gas impact laser perforator, L-500 (trade name, manufactured by Sumitomo Heavy Industries, Ltd.). Next, the resultant was immersed into an aqueous mixed solution of 65 g/L of potassium permanganate and 40 g/L of sodium hydroxide at a solution temperature of 70° C. for 20 minutes to remove smears.

Thereafter, a palladium catalyst, HS-201B (trade name, manufactured by Hitachi Chemical Co., Ltd.) was given thereto, and then CUST-201 (trade name, manufactured by Hitachi Chemical Co., Ltd.) was used to conduct electroless copper plating at a solution temperature of 25° C. for 30 minutes. In this way, an electroless copper plating layer 5 of 0.5 μm thickness was formed as illustrated in FIG. 1(c). Conditions for giving the palladium catalyst are shown in Table 1.

TABLE 1

| Processing step | Processing liquid | Processing conditions |
| --- | --- | --- |
| Cleaner | CLC-501 | 60° C. for 5 minutes |
| Washing with hot water | Pure water | 40° C. for 4 minutes |
| Etching | Ammonium peroxodisulfate 187 g/L | 25° C. for 10 seconds |
| Washing with flowing water | Pure water | 25° C. for 3 minutes |
| Treatment with acid | 10% by volume of sulfuric acid | 25° C. for 3 minutes |
| Washing with flowing water | Pure water | 25° C. for 2 minutes |
| Treatment before catalyst-supply | PD301 | 25° C. for 2 minutes |
| Catalyst-supply treatment | HS-201B | 25° C. for 8 minutes |
| Washing with flowing water | Pure water | 25° C. for 3 minutes |
| Adhesion accelerator | ADP-201 | 25° C. for 4 minutes |
| Washing with flowing water | Pure water | 25° C. for 2 minutes |

As illustrated in FIG. 1(d), a dry film photoresist, RY-3325 (trade name, manufactured by Hitachi Chemical Co., Ltd) was laminated onto the surface of the electroless plating layer. Next, the resultant was exposed to ultraviolet rays through a photomask for masking sites where copper electroplating was to be conducted, and developed to form a plating resist 6.

As illustrated in FIG. 1(e), a copper sulfate bath was used to conduct copper electroplating at a solution temperature of 25° C. and a current density of 1.0 A/dm$^2$ to give a thickness of 20 μm. In this way, a circuit pattern 7 was formed in such a manner that the minimum circuit conductor width/the circuit conductor space (L/S) was 23/17 μm.

Next, as illustrated in FIG. 1(f), the dry film was removed with a resist removing solution, HTO (trade name, manufactured by Nichigo-Morton Co., Ltd.). Thereafter, an etching solution having a composition of 100 g/L of $H_2SO_4$ and 10 g/L of $H_2O_2$ was used to etch and remove copper in areas other than the area of the pattern. In this way, a core substrate was formed. The insulating layer surface roughness Rz of the core substrate was 0.5 μm, and the conductor circuit surface roughness Rz thereof was 1.2 μm. The surface roughnesses were measured on the basis of JIS-B-0601.

Next, the conductor circuit surface was subjected to electroless nickel plating to give a thickness of 1 μm, and then subjected to the following silane coupling treatment:

Solution composition: 3-aminopropyltrimethoxysilane, 5.0 g/L

Solution temperature: 25° C.

Immersing time: 10 seconds

Next, the whole of the substrate was immersed into the resin composition A, pulled up, and then dried at 160° C. for 10 minutes in such a manner that the concentration of the remaining solvent was 1% or less. In this way, the whole of the substrate was coated with the resin composition AI as illustrated in FIG. 1(g), so as to form an adhesion assisting agent 8. The thickness of the coating was about 2 μm after the drying.

A prepreg, GEA-679F (trade name, manufactured by Hitachi Chemical Co., Ltd.) of 0.1 μm thickness and the metal foil BI were laminated on the coated core substrate, and then the resultant was press-formed at 180° C. and 2.5 MPa over 1 hour. The carrier foil on the copper foil was then peeled. In this way, a substrate as illustrated in FIG. 1(h) was produced wherein an insulating layer 9, an adhesion assisting agent layer 11 and a metal foil 10 were formed.

As illustrated in FIG. 1(i), IVHs were perforated. For the perforation of the IVHs, windows having a minimum diameter of 100 gm were made in the copper foil by photolithography. The IVHs 12 having a minimum diameter of 50 μm were made with a carbon dioxide gas impact laser perforator, L-500 (trade name, manufactured by Sumitomo Heavy Industries, Ltd.). Next, the resultant was immersed into an aqueous mixed solution of 65 g/L of potassium permanganate and 40 g/L of sodium hydroxide at a solution temperature of 70° C. for 20 minutes to remove smears and simultaneously roughen the resin surface of the naked area.

Thereafter, a palladium catalyst, HS-201B (trade name, manufactured by Hitachi Chemical Co., Ltd.) was given thereto, and then CUST-201 (trade name, manufactured by Hitachi Chemical Co., Ltd.) was used to conduct electroless copper plating at a solution temperature of 25° C. for 30 minutes. In this way, an electroless copper plating layer 13 of 0.5 μm thickness was formed as illustrated in FIG. 1(j). Conditions for giving the palladium catalyst are shown in Table 2.

TABLE 2

| Processing step | Processing liquid | Processing conditions |
| --- | --- | --- |
| Cleaner | CLC-501 | 60° C. for 5 minutes |
| Washing with hot water | Pure water | 40° C. for 4 minutes |
| Etching | Ammonium peroxodisulfate 187 g/L | 25° C. for 10 seconds |
| Washing with flowing water | Pure water | 25° C. for 3 minutes |
| Treatment with acid | 10% by volume of sulfuric acid | 25° C. for 3 minutes |
| Washing with flowing water | Pure water | 25° C. for 2 minutes |
| Treatment before catalyst-supply | PD301 | 25° C. for 2 minutes |
| Catalyst-supply treatment | HS-201B | 25° C. for 8 minutes |
| Washing with flowing water | Pure water | 25° C. for 3 minutes |
| Adhesion accelerator | ADP-201 | 25° C. for 4 minutes |
| Washing with flowing water | Pure water | 25° C. for 2 minutes |

As illustrated in FIG. 1(k), a dry film photoresist, RY-3325 (trade name, manufactured by Hitachi Chemical Co., Ltd) was laminated onto the surface of the electroless plating layer. Next, the resultant was exposed to ultraviolet rays through a photomask for masking sites where copper electroplating was to be conducted, and developed to form a plating resist 14.

As illustrated in FIG. 1(l), a copper sulfate bath was used to conduct copper electroplating at a solution temperature of 25° C. and a current density of 1.0 A/dm$^2$ to give a thickness of 20 μm. In this way, a circuit pattern 15 was formed in such a manner that the minimum circuit conductor width/the circuit conductor space (L/S) was 23/17 μm.

Next, as illustrated in FIG. 1(m), the dry film was removed with a resist removing solution, HTO (trade name, manufactured by Nichigo-Morton Co., Ltd.). Thereafter, an etching solution having a composition of 100 g/L of $H_2SO_4$ and 10 g/L of $H_2O_2$ was used to etch and remove copper in areas other than the area of the pattern.

After the etching, the minimum circuit conductor width/the circuit conductor space (L/S) was 20/20 μm.

Next, as illustrated in FIG. 1(n), the outermost layer was subjected to electroless gold plating to form a gold plating layer 16. Conditions for the electroless gold plating are shown in Table 3.

TABLE 3

| Processing | Solution | Concentration | Liquid temperature | Immersing time |
| --- | --- | --- | --- | --- |
| Degreasing | Z-200 | | 60° C. | 1 minute |
| Washing with water | | | 25° C. | 2 minutes |
| Soft etching | Ammonium persulfate | 100 g/L | 25° C. | 1 minute |
| Washing with water | | | 25° C. | 2 minutes |
| Washing with acid | Sulfuric acid | 10% by volume | 25° C. | 1 minute |
| Washing with water | | | 25° C. | 2 minutes |
| Activating treatment | SA-100 | | 25° C. | 5 minutes |
| Washing with water | | | 25° C. | 2 minutes |
| Nickel-phosphorus electroless plating | NIPS-100 | | 85° C. | 20 minutes |
| Washing with water | | | 25° C. | 2 minutes |

TABLE 3-continued

| Processing | Solution | Concentration | Liquid temperature | Immersing time |
|---|---|---|---|---|
| Nickel-boron electroless plating | TOP CHEMIALLOY 66 | | 65° C. | 5 minutes |
| Washing with water | | | 25° C. | 2 minutes |
| Palladium electroless plating | PALLET | | 70° C. | 5 minutes |
| Washing with water | | | 25° C. | 2 minutes |
| Gold displacement plating | HGS-100 | | 80° C. | 10 minutes |
| Washing with water | | | 25° C. | 2 minutes |
| Goldelectroless-plating | HGS-2000 | | 65° C. | 40 minutes |

Notes)
Z-200 (trade name, manufactured by Kabushiki Kaisha World Metal),
SA-100 (trade name, manufactured by Hitachi Chemical Co., Ltd.),
NIPS-100 (trade name, manufactured by Hitachi Chemical Co., Ltd.),
TOP CHEMIALLOY 66 (trade name, manufactured by Okuno Chemical Industries Co., Ltd.),
PALLET (trade name, manufactured by Kojima Chemical Reagents Inc.),
HGS-100 (trade name, manufactured by Hitachi Chemical Co., Ltd.), and
HGS-2000 (trade name, manufactured by Hitachi Chemical Co., Ltd.)

Example I-2

A substrate was produced in the same way as in Example I-1 except that when the metal foil BI was produced in Example I-1, the resin composition AI was applied into a thickness of 8 μm.

Example I-3

In the resin composition AI in Example I-1, the blend amount of the novolak epoxy resin (NC3000S-H) having a biphenyl structure was changed to 80 parts by weight, that of the carboxylic acid modified acrylonitrile butadiene rubber particles (XER-91SE-15) was changed to 2 parts by weight, that of the carboxylic acid modified polyvinyl acetal resin (KS-23Z) was changed to 5 parts by weight, and that of the triazine-ring-containing cresol phenol novolak resin (PHENOLITE EXB-9829) was changed to 13 parts by weight. The other operations were performed in the same way as in Example I-1.

Example I-4

In Example I-1, 5 parts by weight of particles having a butadiene rubber core and an acrylic resin shell, EXL-2655 (manufactured by Kureha Chemical Industry Co., Ltd.) were used instead of 5 parts by weight of the carboxylic acid modified acrylonitrile butadiene rubber particles in the resin composition AI. The other operations were performed in the same way as in Example I-1.

Example I-5

In Example I-1, 15 parts by weight of a phenol novolak resin, HP-850N (manufactured by Hitachi Chemical Co., Ltd.) were used instead of 20 parts by weight of the triazine-ring-containing cresol phenol novolak resin in the resin composition AI. The other operations were performed in the same way as in Example I-1.

Example I-6

In the resin composition AI in Example I-1, the blend amount of the novolak epoxy resin (NC3000S-H) having a biphenyl structure was changed to 55 parts by weight, that of the triazine-ring-containing cresol phenol novolak resin (PHENOLITE EXB-9829) was changed to 15 parts by weight, and 15 parts by weight of a phenolic-hydroxyl-containing phosphorus compound, HCA-HQ (Sanko Co., Ltd.) were used. The other operations were performed in the same way as in Example I-1.

Example I-7

In Example I-6, 20 parts by weight of inorganic filler made of spherical silica, ADMAFINE SC-2050 (manufactured by Admatechs Co., Ltd.) were further incorporated into the resin composition AI. The other operations were performed in the same way as in Example I-1.

Reference Example I-1

A substrate was produced in the same way as in Example I-1 except that the metal foil AI was laminated instead of the metal foil BI in the step (h) of Example I-1.

Reference Example I-2

A substrate was produced in the same way as in Example I-1 except that a composition containing the following components was used instead of the resin composition AI:
Epoxy resin, EPOMICR-301 (manufactured by Mitsui Chemicals, Inc.): 40 parts by weight
Rubber modified epoxy resin, EPOTOHTO YR-102 (manufactured by Tohto Chemical Industry Co., Ltd.): 20 parts by weight
Polyvinyl acetal resin, DENKABUTYRAL #5000A (manufactured by Denki Kagaku Kogyo Kabushiki Kaisha): 30 parts by weight Melamine resin, YUBAN 20SB (manufactured by Mitsui Toatsu Chemicals, Inc.): 10 parts by weight (solid content)

Latent epoxy resin curing agent (dicyandiamide): 2 parts by weight (added in the form of a solution thereof in dimethylformamide, having a solid content concentration of 25% by weight)

Curing accelerator, CUREZOL 2E4MZ (manufactured by Shikoku Chemicals Corp.): 0.5 part by weight Solvent, ethyl methyl ketone (Measurement of Conductor Peeling Strength)

The conductor peeling strengths of evaluation-samples for Examples I-1 to I-7 and Reference Examples I-1 and I-2 were measured. As peeling strength, perpendicular peeling strength was measured. As for the portion that the electroless plating was applied onto the copper foil, each of the samples was allowed to stand still at room temperature and subsequently the conductor peeling strength was measured under normal conditions. Further, after the sample was heated at 150° C. for 240 hours, the conductor peeling strength thereof was measured. Furthermore, as for the portion where the electroless copper plating was applied directly onto the resin, the conductor peeling strength thereof was measured under normal conditions after the sample was allowed to stand still at room temperature. The measurement was conducted at 20° C. at any time. Conditions for the measurement are shown in Table 4.

TABLE 4

| Conductor peeling strength test conditions | |
|---|---|
| Items | Conditions |
| Device | Autography AC-100C, manufactured by Shimadzu Corp. |
| Peel speed | 50 mm/min |
| Test width | 1 mm |

(Heat Resistance Test after Moisture Absorption)

The substrates and the evaluation samples for Examples I-1 to I-7 and Reference Examples I-1 and I-2 were subjected to a heat resistance test after moisture absorption. In the test of the substrates, each sample thereof was treated at 121° C., a humidity of 100%, and a pressure of 2 atmospheres for 2 hours. Thereafter, the sample was immersed into a 260° C. solder bath for 20 seconds. It was then checked whether swelling or the like was generated in the substrate or not. For the test, a saturation type PCT device PC-242 manufactured by Hirayama Manufacturing Corp. was used.

(Connection Reliability Evaluation)

Figure 2:
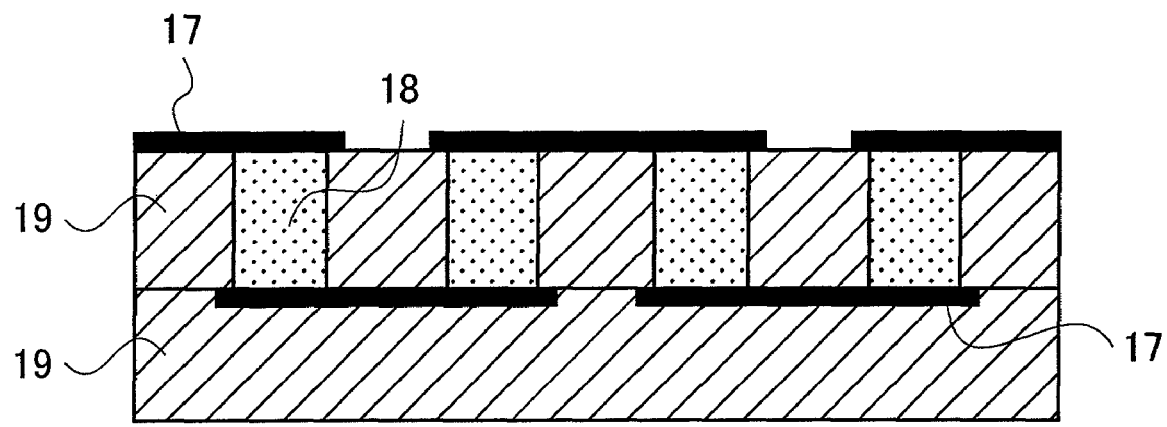
FIG. 2 is a sectional view of a substrate for evaluation connection reliability.

The substrates and the evaluation-samples for Examples I-1 to I-7 and Reference Examples I-1 and I-2 were subjected to a connection reliability test. For connection reliability evaluation, a pattern illustrated in FIG. 2 was used. In FIG. 2, a conductor circuit, IVHs, and an insulating layer are represented by 17, 18 and 19, respectively. The specification of the pattern illustrated in FIG. 2 is shown in Table 5. In the connection reliability evaluation, a cycle of 30 minutes at −65° C. and 30 minutes at 125° C. was rendered one cycle. A sample exhibiting a resistance value variation of 11% or less after 1,000 cycles was regarded as an accepted product.

TABLE 5

| | Unit | |
|---|---|---|
| IVH diameter | μm | 80 |
| IVH pitch | mm | 1.27 |

TABLE 5-continued

| | Unit | |
|---|---|---|
| Inner layer pad diameter | μm | 150 |
| External layer land diameter | μm | 150 |
| IVH number | — | 400 |

(Test Results)

The test results are shown in Table 6. All of the substrates and evaluation-samples produced in Examples I-1 to I-7 had a high conductor peeling strength of 0.6 kN/m or more. On the other hand, the substrates and evaluation-samples produced in Reference Examples I-1 and I-2 had a small conductor peeling strength, and after the heat resistance test, swelling was generated between their insulating layer and conductor. Moreover, good results were not obtained in the connection reliability thereof.

TABLE 6

Test results of Examples I-1 to I-7 and Reference Examples I-1 to I-2

| | Conductor peeling strength (kN/m) | | | | |
|---|---|---|---|---|---|
| | Normal conditions | 150° C. | Electroless plating portions (normal conditions) | Swelling after the heat resistance test | Connection reliability |
| Example 1 | 1.2 | 0.7 | 0.31 | Not generated | Good |
| Example 2 | 1.4 | 0.7 | 0.35 | Not generated | Good |
| Example 3 | 1.1 | 0.6 | 0.28 | Not generated | Good |
| Example 4 | 1.1 | 0.7 | 0.25 | Not generated | Good |
| Example 5 | 1.0 | 0.6 | 0.23 | Not generated | Good |
| Example 6 | 1.0 | 0.6 | 0.30 | Not generated | Good |
| Example 7 | 0.9 | 0.6 | 0.29 | Not generated | Good |
| Reference Example 1 | 0.3 | 0.2 | 0 | Generated | Bad |
| Reference Example 1 | 0.7 | 0.3 | 0 | Generated | Bad |

Example II-1

The following resin composition AII was produced.

(Resin Composition AII)

Aralkyl epoxy resin, ESN-480 (manufactured by Nippon Steel Chemical Co., Ltd.): 62 parts by weight Aralkyl resin having a phenolic hydroxyl group, HEM-7851 (manufactured by Meiwa Chemical Industry Co., Ltd.): 30 parts by weight Carboxylic acid modified acrylonitrile butadiene rubber particles, XER-91SE-15 (manufactured by JSR Corp.): 8 parts by weight Imidazole derivative compound, 1-cyanoethyl-2 phenylimidazolium trimellitate, 2PZ-CNS (manufactured by Shikoku Chemicals Corp.): 0.3 part by weight Solvent, methyl ethyl ketone (Metal Foil BII)

The resin composition AII was applied onto a bondable face of an electrodeposited copper foil (trade name: FO-WS18, manufactured by Furukawa Circuit Foil Co., Ltd., Rz=1.2 μm) of 510 mm width and 18 μm thickness. After the applying, the resultant was dried at 170° C. for about 10 minutes in such a manner that the concentration of the remaining solvent was 3% or less. In this way, a metal foil BII, which was an adhesive fitted metal foil, was produced. The thickness of the applied resin composition AII was 3.0 μm after it was dried.

Pieces of the metal foil BII were laminated onto the upper and lower faces of four prepregs, GEA-679F (thickness: 0.1 μm), manufactured by Hitachi Chemical Co., Ltd. in such a manner that the resin composition AII of metal foil BII was brought into contact with the prepregs. This was press-formed at 180° C. and 2.5 MPa over 1 hour to produce a copper-clad laminated board.

Next, a dry film photoresist was laminated onto the surface of the copper-clad laminated board, exposed to ultraviolet rays through a photomask for masking sites to be etched, and developed to form an etching resist.

A circuit pattern was formed in such a manner that the minimum circuit conductor width/the circuit conductor space (L/S) was 30/30 μm, and the resist was removed to produce an inner layer plate. The insulating layer surface roughness Rz of the core substrate was 1.2 μm, and the conductor circuit surface roughness Rz thereof was 1.1 μm. The surface roughness was measured on the basis of JIS-B-0601.

Next, bonding treatment of the inner layer circuit was conducted by redox treatment, and then pieces of the metal foil BII were laminated on the upper and lower faces of a high Tg epoxy resin prepreg GEA-679F (thickness: 0.1 mm) in such a manner that the resin composition AII of the metal foil BII was brought into contact with the prepreg. Next, the resultant was press-formed at 180° C. and 2.5 MPa over 1 hour to produce a copper-clad laminated board. Thereafter, an etching resist was used to form a circuit pattern in the same way as in the inner layer plate, thereby forming a multi-layered wiring board. This was used as an evaluation-sample. The insulating layer surface roughness Rz of the core substrate was 1.2 μm and the conductor circuit surface roughness Rz thereof was 1.1 μm.

Example II-2

An evaluation-sample was formed in the same way as in Example II-1 except that when the metal foil BII was formed in Example II-1, the resin composition AII was applied into a thickness of 6 μm.

Example II-3

In Example II-1, 62 parts by weight of the NC3000S-H (manufactured by Nippon Kayaku Co., Ltd.) were used as the aralkyl epoxy resin, 20 parts by weight of the SN-480 (manufactured by Nippon Steel Chemical Co., Ltd.) were used as the aralkyl resin having a phenolic hydroxyl group, and 10 parts by weight of the triazine-ring-containing cresol phenol novolak resin, LA-3018 (manufactured by Dainippon Ink & Chemicals, Inc.) were used. The other operations were performed in the same way as in Example II-1.

Example II-4

In Example II-3, 8 parts by weight of particles having a butadiene rubber core and an acrylic resin shell, EXL-2655 (manufactured by Kureha Chemical Industry Co., Ltd.) were used instead of 8 parts by weight of the carboxylic acid modified acrylonitrile butadiene rubber particles. The other operations were performed in the same way as in Example II-3.

Example II-5

In Example II-3, 5 parts by weight of a polyvinyl acetal resin, KS-23Z (manufactured by Sekisui Chemical Co., Ltd.) were added. The other operations were performed in the same way as in Example II-3.

Reference Example II-1

An evaluation-sample was formed in the same way as in Example II-1 except that an FO-WS foil 18 μm (manufactured by Furukawa Circuit Foil Co., Ltd.) was laminated instead of the metal foil AII in Example II-1.

Reference Example II-2

An evaluation-sample was formed in the same way as in Example II-1 except that at the time of forming the resin composition AII in Example II-1, 60 parts by weight of a cresol novolak epoxy resin, N-665 (manufactured by Dainippon Ink & Chemicals, Inc.) were used as the epoxy resin and 30 parts by weight of a phenol novolak resin, HP-850N (manufactured by Hitachi Chemical Co., Ltd.) were used as the epoxy resin curing agent.

Reference Example II-3

The same operations as in Example II-1 were performed except that a composition containing the following components was used instead of the resin composition AII:

Epoxy resin, EPOMICR-301 (manufactured by Mitsui Chemicals, Inc.): 40 parts by weight Rubber modified epoxy resin, EPOTOHTO YR-102 (Tohto Chemical Industry Co., Ltd.): 20 parts by weight Polyvinyl acetal resin, DENKABUTYRAL #5000A (manufactured by Denki Kagaku Kogyo Kabushiki Kaisha): 30 parts by weight Melamine resin, YUBAN 20SB (manufactured by Mitsui Toatsu Chemicals, Inc.): 10 parts by weight (solid content)

Latent epoxy resin curing agent (dicyandiamide): 2 parts by weight (added in the form of a solution thereof in dimethylformamide, having a solid content concentration of 25% by weight)

Curing accelerator, CUREZOL2E4MZ (manufactured by Shikoku Chemicals Corp.): 0.5 part by weight Solvent, ethyl methyl ketone (Measurement of Conductor Peeling Strength)

The conductor peeling strengths of the evaluation-samples for Examples II-1 to II-6 and Reference Examples II-1 and II-3 were measured. As the peel strength, perpendicular peeling strength was measured. The measurement was conducted at 20° C. at any time. The method for the measurement was according to JIS-C-6481.

(Heat Resistance Test after Moisture Absorption)

The evaluation-samples for Examples II-1 to II-6 and Reference Examples II-1 and II-3 were subjected to a heat resistance test after moisture absorption. In the test of the substrates, each sample thereof was treated at 121° C., a humidity of 100%, and a pressure of 2 atmospheres for 2 hours. Thereafter, the sample was immersed into a 288° C. solder bath for 20 seconds. It was then checked whether swelling or the like was generated in the substrate or not. For the test, a saturation type PCT device PC-242 manufactured by Hirayama Manufacturing Corp. was used.

(Test Results)

The test results are shown in Table 7. All of the evaluation-samples produced in Examples II-1 to II-6 had a high conductor peeling strength of 0.7 kN/m or more. On the other hand, the evaluation-samples obtained in Reference Examples II-1 and II-3 had a small conductor peeling strength, and after the heat resistance test, swelling was generated between their insulating layer and inner conductor.

TABLE 7

Test results of Examples II-1 to II-5 and Reference Examples II-1 to II-3

| Items | Conductor peeling strength (kN/m) | Swelling after the heat resistance test |
|---|---|---|
| Example 1 | 0.7 | Not generated |
| Example 2 | 0.9 | Not generated |
| Example 3 | 0.8 | Not generated |
| Example 4 | 0.7 | Not generated |
| Example 5 | 0.9 | Not generated |
| Reference Example 1 | 0.2 | Generated |
| Reference Example 2 | 0.3 | Generated |
| Reference Example 3 | 0.7 | Generated |

Example III-1

The following resin composition AIII was prepared:
(Resin Composition AIII)
Novolak epoxy resin having a biphenyl structure, NC3000S-H (manufactured by Nippon Kayaku Co., Ltd.): 35 parts by weight
Rubber modified epoxy resin, EPICLON TSR-960 (manufactured by Dainippon Ink & Chemicals, Inc.): 30 parts by weight
Carboxylic acid modified acrylonitrile butadiene rubber particles, XER-91SE-15 (manufactured by JSR Corp.): 5 parts by weight
Carboxylic acid modified polyvinyl acetal resin, KS-23Z (manufactured by Sekisui Chemical Co., Ltd.): 10 parts by weight
Triazine-ring-containing cresol phenol novolak resin, PHENOLITE LA-301 (manufactured by Dainippon Ink & Chemicals, Inc.; nitrogen content: 18% by weight, and hydroxyl equivalent: 151): 20 parts by weight
Imidazole derivative compound, 1-cyanoethyl-2 phenylimidazolium trimellitate, 2PZ-CNS (manufactured by Shikoku Chemicals Corp.): 0.3 part by weight
Solvent, methyl ethyl ketone
(Metal Foil BIII)
The resin composition AIII was applied onto a glossy face of an electrodeposited copper foil of 510 mm width and 12 µm thickness (trade name: FO-WS12, manufactured by Furukawa Circuit Foil Co., Ltd., Rz=1.2 µm). After the applying, the resultant was dried at 160° C. for about 10 minutes in such a manner that the concentration of the remaining solvent was 5% or less, thereby producing a metal foil BIII, which was an adhesion assisting agent fitted metal foil. The thickness of the applied resin composition AIII was 3.0 µm after it was dried.

Pieces of the metal foil BIII were laminated on the upper and lower faces of four, high Tg epoxy resin prepregs GEA-679F (thickness: 0.1 mm) manufactured by Hitachi Chemical Co., Ltd. in such a manner that the resin composition AIII of the metal foil BIII was applied was brought into contact with the prepregs. Next, the resultant was press-formed at 180° C. and 2.5 MPa for 1 hour to produce a copper-clad laminated board.

Next, a dry film photoresist, RY-3325 (tradename, manufactured by Hitachi Chemical Co., Ltd) was laminated onto the surface of the electroless plating layer. The resultant was then exposed to ultraviolet rays through a photomask for masking sites where copper electroplating was to be conducted, and developed to form a plating resist.

A circuit pattern was formed in such a manner that the minimum circuit conductor width/the circuit conductor space (L/S) was 20/20 µm.

Next, the dry film was removed with a resist removing solution, HTO (trade name, manufactured by Nichigo-Morton Co., Ltd.). The insulating layer surface roughness Rz of the core substrate was 1.2 µm, and the conductor circuit surface roughness Rz thereof was 1.1 µm. The surface roughnesses were measured on the basis of JIS-B-0601.

Example III-2

A substrate was produced in the same way as in Example III-1 except that at the time of forming the metal foil BIII in Example III-1, the resin composition AIII was applied into a thickness of 8 µm.

Example III-3

In Example III-1, the blend amount of the novolak epoxy resin (NC3000S-H) having a biphenyl structure was changed to 50 parts by weight, that of the rubber modified epoxy resin (TSR-960) was changed to 30 parts by weight, that of the carboxylic acid modified acrylonitrile butadiene rubber particles (XER-91SE-15) was changed to 2 parts by weight, that of the carboxylic acid modified polyvinyl acetal resin (KS-23Z) was changed to 5 parts by weight, and that of the triazine-ring-containing cresol phenol novolak resin (PHENOLITE LA-3018) was changed to 13 parts by weight. The other operations were performed in the same way as in Example III-1.

Example III-4

In Example III-1, 5 parts by weight of particles having a butadiene rubber core and an acrylic resin shell, EXL-2655 (manufactured by Kureha Chemical Industry Co., Ltd.) were used instead of 5 parts by weight of the carboxylic acid modified acrylonitrile butadiene rubber particles. The other operations were performed in the same way as in Example III-1.

Example III-5

In Example III-1, 15 parts by weight of a phenol novolak resin, HP-850N (manufactured by Hitachi Chemical Co., Ltd.) were used instead of 20 parts by weight of the triazine-ring-containing cresol phenol novolak resin. The other operations were performed in the same way as in Example III-1.

Reference Example III-1

A substrate was produced in the same way as in Example III-1 except that an F0-WS12 foil was laminated instead of the metal foil A in Example III-1.

Reference Example III-2

A substrate was produced in the same way as in Example III-1 except that at the time of producing the resin composition AIII in Example III-1, the amount of the NC-3000S-H was changed to 65 parts by weight without using the EPICLON TSR-960.

Reference Example III-3

A substrate was produced in the same way as in Example III-1 except that a composition containing the following components was used instead of the resin composition AIII in Example III-1:

Epoxy resin, EPOMICR-301 (manufactured by Mitsui Chemicals, Inc.): 40 parts by weight Rubber modified epoxy resin, EPOTOHTO YR-102 (manufactured by Tohto Chemical Industry Co., Ltd.): 20 parts by weight Polyvinyl acetal resin, DENKABUTYRAL #5000A (manufactured by Denki Kagaku Kogyo Kabushiki Kaisha): 30 parts by weight Melamine resin, YUBAN 20SB (manufactured by Mitsui Toatsu Chemicals, Inc.): 10 parts by weight (solid content)

Latent epoxy resin curing agent (dicyandiamide): 2 parts by weight (added in the form of a solution thereof in dimethylformamide, having a solid content concentration of 25% by weight)

Curing accelerator, CUREZOL2E4MZ (manufactured by Shikoku Chemicals Corp.): 0.5 part by weight Solvent, ethyl methyl ketone (Measurement of Conductor Peeling Strength)

The conductor peeling strengths of evaluation-samples for Examples III-1 to III-6 and Reference Examples III-1 and III-3 were measured. As the peel strength, perpendicular peeling strength was measured. The measurement was conducted at 20° C. at any time. The method for the measurement was according to JIS-C-6481.

(Heat Resistance Test after Moisture Absorption)

The substrates and evaluation-samples for Examples III-1 to III-6 and Reference Examples III-1 and III-3 were subjected to a heat resistance test after moisture absorption. In the test of the substrates, each sample thereof was treated at 121° C., a humidity of 100%, and a pressure of 2 atmospheres for 2 hours. Thereafter, the sample was immersed into a 260° C. solder bath for 20 seconds. It was then checked whether swelling or the like was generated in the substrate or not. For the test, a saturation type PCT device PC-242 manufactured by Hirayama Manufacturing Corp. was used.

(Test Results)

The test results are shown in Table 8. All of the substrates and evaluation-samples produced in Examples III-1 to III-6 had a high conductor peeling strength of 0.6 kN/m or more. On the other hand, the substrates and evaluation-samples obtained in Reference Examples III-1 and III-3 had a small conductor peeling strength, and after the heat resistance test, swelling was generated between their insulating layer and inner conductor. Moreover, good results were not obtained in the connection reliability thereof.

TABLE 8

Test results of Examples III-1 to III-5 and Reference Examples III-1 to III-3

| | Conductor peeling strength (kN/m) | | | |
|---|---|---|---|---|
| Items | Normal conditions | 150° C. | Electroless plating portions (normal conditions) | Swelling after the heat resistance test |
| Example 1 | 1.2 | 0.7 | 0.31 | Not generated |
| Example 2 | 1.4 | 0.7 | 0.35 | Not generated |
| Example 3 | 1.1 | 0.6 | 0.28 | Not generated |
| Example 4 | 1.1 | 0.7 | 0.25 | Not generated |
| Example 5 | 1.0 | 0.6 | 0.23 | Not generated |
| Reference Example 1 | 0.3 | 0.2 | 0.05 | Generated |
| Reference Example 2 | 0.5 | 0.2 | 0.08 | Generated |
| Reference Example 3 | 0.7 | 0.3 | 0 | Generated |

The invention claimed is:

1. An adhesion assisting agent fitted metal foil, comprising an adhesion assisting agent layer having a thickness of 0.1 to 10 μm on a metal whose surface has a ten-point average roughness Rz of 2.0 μm or less,
   wherein the adhesion assisting agent layer is formed from an adhesion assisting agent composition comprising: (A) an epoxy resin which comprises a novolak epoxy resin, the component (A) having a biphenyl structure; and (C) an epoxy resin curing agent, and
   wherein the adhesion assisting agent composition further comprises (B) a polymer which is able to be chemically roughened, selected from the group consisting of cross-linked rubber particles, polyvinyl acetal resin and a carboxylic acid modified polyvinyl acetal resin, and (D) a curing accelerator.

2. The adhesion assisting agent fitted metal foil according to claim 1, wherein the component (B) is cross-linked rubber particles.

3. The adhesion assisting agent fitted metal foil according to claim 1, wherein the component (B) is selected from the group consisting of acrylonitrile butadiene rubber, carboxylic acid modified acrylonitrile butadiene rubber, carboxylic acid modified acrylonitrile butadiene rubber particles, and particles having a butadiene rubber core and an acrylic resin shell.

4. The adhesion assisting agent fitted metal foil according to claim 1, wherein the component (B) is selected from the group consisting of a polyvinyl acetal resin and a carboxylic acid modified polyvinyl acetal resin.

5. The adhesion assisting agent fitted metal foil according to claim 1, wherein the amount of the component (B) is from 0.5 to 25 parts by weight for 100 parts by weight of the component (A).

6. The adhesion assisting agent fitted metal foil according to claim 1, wherein the component (C) is a phenol novolak resin.

7. The adhesion assisting agent fitted metal foil according to claim 1, wherein the component (C) is a triazine-ring-containing phenol novolak resin.

8. The adhesion assisting agent fitted metal foil according to claim 1, wherein the surface of the metal is not subjected to any roughening treatment for promoting adhesive force.

9. The adhesion assisting agent fitted metal foil according to claim 1, wherein the metal is copper foil subjected to rust preventing treatment with at least one selected from zinc, chromium, nickel and oxide thereof.

10. The adhesion assisting agent fitted metal foil according to claim 1, wherein the surface of the metal is subjected to silane coupling treatment.

11. A printed-wiring board produced by use of the metal foil according to claim 1, wherein the peeling strength between the adhesion assisting agent layer adhering to an insulating layer and an electroconductive circuit is 0.6 kN/m or more at 20° C.

12. A printed-wiring board having any one of a through hole structure and an interstitial via hole structure, which is produced by use of the adhesion assisting agent fitted metal foil according to claim 1, a first plating being formed by electroless copper plating when the through hole structure or the interstitial via hole structure is formed.

13. The adhesion assisting agent fitted metal foil according to claim 1, wherein the component (C) comprises an aralkyl resin having a phenolic hydroxyl group.

14. The adhesion assisting agent fitted metal foil according to claim 13, wherein the component (C) further comprises 3 to 50% by equivalent of a triazine-ring-containing novolak resin having a phenolic hydroxyl group.

15. The adhesion assisting agent fitted metal foil according to claim 13, wherein the amount of the component (B) is from 0.5 to 25 parts by weight for 100 parts by weight of the component (A).

16. The adhesion assisting agent fitted metal foil according to claim 13, wherein the component (B) is selected from the group consisting of acrylonitrile butadiene rubber, carboxylic acid modified acrylonitrile butadiene rubber, carboxylic acid modified acrylonitrile butadiene rubber particles, particles having a butadiene rubber core and an acrylic resin shell, polyvinyl acetal resin, and carboxylic acid modified polyvinyl acetal resin.

17. The adhesion assisting agent fitted metal foil according to claim 13, wherein the surface of the metal foil is not subjected to any roughening treatment.

18. The adhesion assisting agent fitted metal foil according to claim 13, wherein the metal foil is copper foil subjected to rust preventing treatment with at least one selected from the group consisting of nickel, tin, zinc, chromium, molybdenum, cobalt and oxide thereof.

19. A printed-wiring board, which is produced by using the adhesion assisting agent fitted metal foil according to claim 1.

20. A process for producing a printed-wiring board, which comprises the step of using the adhesion assisting agent fitted metal foil according to claim 1.

21. An adhesion assisting agent fitted metal foil, comprising an adhesion assisting agent layer having a thickness of 0.1 to 10 μm on a metal whose surface has a ten-point average roughness Rz of 2.0 μm or less, and the surface of the adhesion assisting agent layer is able to undergo electroless plating by roughening chemically the surface of the adhesion assisting agent layer after any metal is chemically removed, wherein the adhesion assisting agent layer comprises an adhesion assisting agent composition comprising (A) an epoxy resin, and the component (A) comprises a novolak epoxy resin and a rubber modified epoxy resin, wherein the adhesion assisting agent composition further comprises (B) a polymer component which is able to be chemically roughened, (C) an epoxy resin curing agent, and (D) a curing accelerator, wherein 10 to 80% by weight of the component (A) is the rubber modified epoxy resin, and wherein the component (B) is selected from the group consisting of acrylonitrile butadiene rubber, carboxylic acid modified acrylonitrile butadiene rubber, carboxylic acid modified acrylonitrile butadiene rubber particles, particles having a butadiene rubber core and an acrylic resin shell, polyvinyl acetal resin, and carboxylic acid modified polyvinyl acetal resin, and the amount of the component (B) is from 0.5 to 25 parts by weight for 100 parts by weight of the component (A).

22. The adhesion assisting agent fitted metal foil according to claim 21, wherein the component (C) is selected from the group consisting of a phenol novolak resin and a triazine-ring-containing phenol novolak resin.

23. The adhesion assisting agent fitted metal foil according to claim 21, wherein the surface of the metal foil is not subjected to any roughening treatment for promoting adhesive force.

24. The adhesion assisting agent fitted metal foil according to claim 21, wherein the metal foil is copper foil subjected to rust preventing treatment with at least one selected from the group consisting of nickel, tin, zinc, chromium, molybdenum, cobalt and oxide thereof.

* * * * *